(12) United States Patent
Lee et al.

(10) Patent No.: US 8,216,947 B2
(45) Date of Patent: Jul. 10, 2012

(54) METHODS OF FORMING FINE PATTERNS IN INTEGRATED CIRCUIT DEVICES

(75) Inventors: Young-Ho Lee, Seoul (KR); Jae-Kwan Park, Gyeonggi-do (KR); Jae-Hwang Sim, Gyeonggi-do (KR); Sang-Yong Park, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 577 days.

(21) Appl. No.: 12/418,023

(22) Filed: Apr. 3, 2009

(65) Prior Publication Data

US 2010/0096719 A1    Apr. 22, 2010

(30) Foreign Application Priority Data

Oct. 22, 2008    (KR) ........................ 10-2008-0103721

(51) Int. Cl.
*H01L 21/336* (2006.01)
*H01L 21/302* (2006.01)
*H01L 21/4763* (2006.01)

(52) U.S. Cl. ......................... 438/717; 438/267; 438/622

(58) Field of Classification Search ................. 438/669, 438/267, 622, 717; 430/313
See application file for complete search history.

(56) References Cited

U.S. PATENT DOCUMENTS

| | | | |
|---|---|---|---|
| 5,068,202 A * | 11/1991 | Crotti et al. | ................... 438/433 |
| 6,475,891 B2 | 11/2002 | Moon | |
| 6,723,607 B2 | 4/2004 | Nam et al. | |
| 7,115,525 B2 | 10/2006 | Abatchev et al. | |
| 7,253,118 B2 | 8/2007 | Tran et al. | |
| 2007/0123053 A1 | 5/2007 | Kim et al. | |
| 2007/0210449 A1 | 9/2007 | Caspary et al. | |
| 2007/0238053 A1* | 10/2007 | Hashimoto | ................... 430/313 |
| 2008/0220600 A1 | 9/2008 | Alapati et al. | |

FOREIGN PATENT DOCUMENTS

| | | |
|---|---|---|
| JP | 2008-27978 A | 2/2008 |
| KR | 10-2006-0135126 A | 12/2006 |

* cited by examiner

*Primary Examiner* — James Mitchell
(74) *Attorney, Agent, or Firm* — Myers Bigel Sibley & Sajovec, P.A.

(57) ABSTRACT

A method of fabricating an integrated circuit device includes forming first and second mask structures on respective first and second regions of a feature layer. Each of the first and second mask structures includes a dual mask pattern and an etch mask pattern thereon having an etch selectivity relative to the dual mask pattern. The etch mask patterns of the first and second mask structures are isotropically etched to remove the etch mask pattern from the first mask structure while maintaining at least a portion of the etch mask pattern on the second mask structure. Spacers are formed on opposing sidewalls of the first and second mask structures. The first mask structure is selectively removed from between the spacers in the first region using the portion of the etch mask pattern on the second mask structure as a mask to define a first mask pattern including the opposing sidewall spacers with a void therebetween in the first region, and a second mask pattern including the opposing sidewall spacers with the second mask structure therebetween in the second region. The feature layer may be patterned using the first mask pattern as a mask to define a first feature on the first region, and using the second mask pattern as a mask to define a second feature on the second region having a greater width than the first feature.

20 Claims, 46 Drawing Sheets

US 8,216,947 B2

METHODS OF FORMING FINE PATTERNS IN INTEGRATED CIRCUIT DEVICES

CROSS-REFERENCE TO RELATED APPLICATIONS

This application claims priority to Korean Patent Application No. 10-2008-0103721, filed in the Korean Intellectual Property Office on Oct. 22, 2008, the disclosure of which is incorporated by reference herein in its entirety. This application is also related to U.S. patent application Ser. No. 12/428,963.

FIELD

The present invention relates to the field of integrated circuit devices in general, and more particularly, to methods of fabricating integrated circuit devices.

BACKGROUND

As semiconductor devices have become more highly integrated, the size of features in the semiconductor devices and the spacings therebetween have been reduced. As a result, the pitch of the various patterns used to form the device features have been scaled-down. However, it has become increasingly difficult to form sufficiently fine line and space patterns (hereinafter referred to as "L/S patterns") on various substrate materials due to the resolution limitations of conventional photolithography processes used to form the patterns.

One of the ways that these semiconductor devices have been more highly integrated is through the use of a photolithography process sometimes referred to as self-aligned reverse patterning (SARP) to form relatively fine patterns having a relatively fine pitch. According to the self-aligned reverse patterning approach, a pattern can be formed on a layer in which features (a feature layer) are to be formed. A conformal layer can be formed on the pattern and subsequently removed from the feature layer and the pattern, except that portions of the conformal layer can remain on sidewalls of the pattern. Then, the pattern can be removed from the feature layer such that the portions of the conformal layer on the sidewalls remain. The remaining portions of the conformal layer can define a mask pattern that can be used to etch a reverse pattern into the feature layer.

The use of photolithography to form patterns for use in the manufacture of semiconductor devices is also discussed in, for example, U.S. Pat. Nos. 6,475,891; 6,723,607; 7,115,525; and 7,253,118.

SUMMARY

Embodiments according to the inventive concept can provide for the simultaneous formation of a plurality of mask patterns through a single photolithography process, where the mask patterns include respective mask pattern elements that have different widths.

According to some embodiments of the present inventive concept, a method of fabricating an integrated circuit device includes forming first and second mask structures on respective first and second regions of a feature layer. Each of the first and second mask structures includes a dual mask pattern and an etch mask pattern thereon having an etch selectivity relative to the dual mask pattern. The etch mask patterns of the first and second mask structures are isotropically etched to remove the etch mask pattern from the first mask structure while maintaining at least a portion of the etch mask pattern on the second mask structure. Spacers are formed on opposing sidewalls of the first and second mask structures. The first mask structure is selectively removed from between the spacers in the first region using the portion of the etch mask pattern on the second mask structure as a mask to define a first mask pattern including the opposing sidewall spacers with a void therebetween in the first region, and a second mask pattern including the opposing sidewall spacers with the second mask structure therebetween in the second region. The feature layer may be patterned using the first mask pattern as a mask to define a first feature on the first region, and using the second mask pattern as a mask to define a second feature on the second region having a greater width than the first feature.

In some embodiments, prior to isotropically etching, a thickness of the etch mask pattern of the second mask structure may be greater than half of a width of the etch mask pattern of the first mask structure.

In other embodiments, in forming the spacers, a spacer mask layer may be formed on the first and second mask patterns. The spacer mask layer may have an etch selectivity relative to the etch mask pattern and/or the dual mask pattern. The spacer mask layer may be etched to expose respective surfaces of the first and second mask structures between the opposing sidewalls thereof. The first mask structure may be selectively removed by etching the exposed surfaces of the first mask structure and the second mask structure using the portion of the etch mask pattern on the second mask structure as a mask to remove the dual mask pattern of the first mask structure without substantially removing the dual mask pattern of the second mask structure.

According to other embodiments of the present inventive concept, a device includes a substrate having a first region and a second region. The first region includes a first plurality of features thereon, and the second region includes a second plurality of features thereon having respective widths greater than those of the first plurality of features in the first region. The first and second pluralities of features are formed on the first and second regions of the substrate by forming first and second mask structures on respective first and second regions of a feature layer. Each of the first and second mask structures includes a dual mask pattern and an etch mask pattern thereon having an etch selectivity relative to the dual mask pattern. The etch mask patterns of the first and second mask structures are isotropically etched to remove the etch mask pattern from the first mask structure while maintaining at least a portion of the etch mask pattern on the second mask structure. Spacers are formed on opposing sidewalls of the first and second mask structures, and the first mask structure is selectively removed from between the spacers using the portion of the etch mask pattern on the second mask structure as a mask. The feature layer is patterned using the spacers as a mask to define the first plurality of features on the first region, and is patterned using the second mask structure and the spacers on the opposing sidewalls thereof as a mask to define the second plurality of features on the second region.

BRIEF DESCRIPTION OF THE DRAWINGS

FIGS. 8a-14a are plan views of the highlighted portions of the semiconductor device of FIG. 7 illustrating methods of simultaneously forming a plurality of mask patterns using self aligned reverse patterning in accordance with some embodiments of the inventive concept.

FIGS. 8b-14b are cross-sectional views of the highlighted portions of the semiconductor device of FIG. 7 illustrating methods of simultaneously forming a plurality of mask patterns using self aligned reverse patterning in accordance with some embodiments of the inventive concept.

DETAILED DESCRIPTION OF THE EMBODIMENTS

Figure 1:
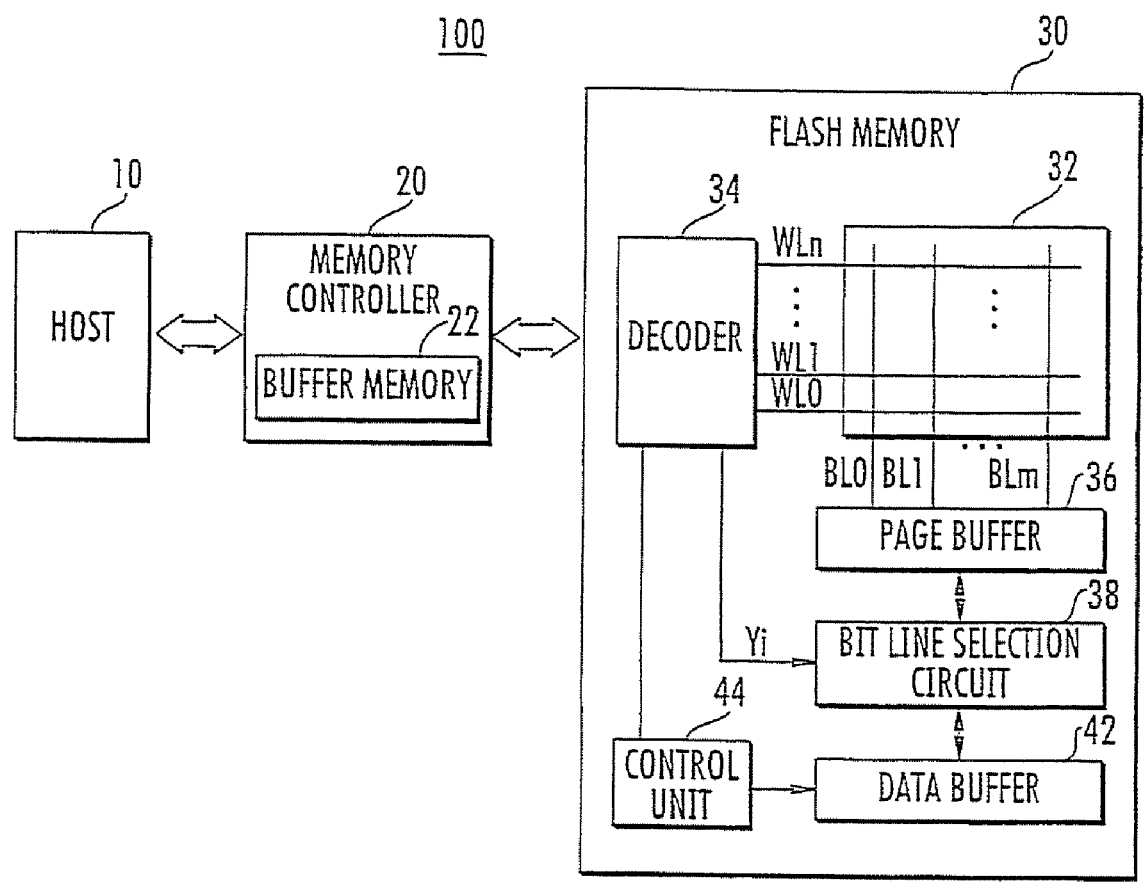
FIG. 1 is a block diagram illustrating a system including a non-volatile memory device in some embodiments according to the inventive concept.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the inventive concept. As used herein, the singular forms "a," "an" and "the" are intended to include the plural forms as well, unless the context clearly indicates otherwise. It will be further understood that the terms "comprises," "comprising," "having," "having," "includes," and/or "including" when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (or variations thereof), it can be directly on or extend directly onto the other element or intervening elements may also be present. In contrast, when an element is referred to as being "directly on" or extending "directly onto" another element (or variations thereof), there are no intervening elements present. It will also be understood that when an element is referred to as being "connected" or "coupled" to another element (or variations thereof), it can be directly connected or coupled to the other element or intervening elements may be present. In contrast, when an element is referred to as being "directly connected" or "directly coupled" to another element (or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present inventive concept.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the FIG. 1 is turned over, elements described as being on the "backside" of substrate would then be oriented on "upper" surface of the substrate. The exemplary term "upper", can therefore, encompasses both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" can, therefore, encompass both an orientation of above and below.

Embodiments of the present inventive concept are described herein with reference to cross section and perspective illustrations that are schematic illustrations of idealized embodiments of the present inventive concept. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present inventive concept may arise from realization that masks for forming low density patterns (having relatively large widths) may conventionally be formed after masks for forming high density patterns (having relatively small widths), which may result in misalignment between the low density patterns and the high density patterns. Thus, as described herein below in greater detail, embodiments according to the inventive concept can provide for the simultaneous formation of a plurality of mask patterns using self aligned reverse patterning. The masks patterns may include respective mask pattern elements that have different widths. For example, in some embodiments according to the inventive concept, elements having different widths and/or different spacing therebetween can be formed simultaneously on a feature layer, which is subsequently subject to etching using patterns having different size/space elements therein. Accordingly, embodiments of the present inventive concept can help to reduce alignment problems during fabrication of semiconductor devices by simultaneously forming mask patterns having different sized elements through the same photolithography process.

Still further, in some embodiments according to the inventive concept, one of the mask patterns can be formed by removing structures that have sidewall spacers formed thereon in one area of the device, whereas a second area of the device includes a structure that is maintained between the sidewall spacers. Accordingly, maintaining the structure in the second area region of the chip while removing the structure in the first region can help to provide the elements having different sizes. In particular, in the first region described above, the elements in the corresponding mask can be defined as the sidewall spacers themselves, which are left behind once the structure is removed. Furthermore, the element in the second region of the chip can include both the sidewall spacers as well as the structure maintained therebetween. Accordingly, the different elements included in the different patterns in different regions of the chip can have different sizes.

FIG. 1 is a high level block diagram illustrating a system 100 including a non-volatile memory device 30 including a decoder circuit 34 that drives word lines WL0-WLn coupled to a cell array 32. The cell array 32 of the non-volatile memory 30 may include a plurality of memory cells. The cell array 32 is also coupled to a page buffer 36 via bitlines BL0-BLm. It will be understood that the decoder 34 can be used to address selective memory cells within the array 32 upon which data is provided to the page buffer 36 via the bitlines BL0-BLm.

Further, the decoder 34 can control a bitline selection circuit 38, which can select data provided by the page buffer 36 via a control line Yi. The selected data from the bitline selection circuit 38 can be provided through a data buffer 42 that operates under the control of a control unit 44 also directed by the decoder 34.

The non-volatile memory 30 can be controlled by a memory controller circuit 20 including ancillary control circuits configured to operate the non-volatile memory 30 to carry out read and write cycles thereto. In particular, when addresses from memory controller 20 are input to the decoder 34, the decoder 34 may generate the selection signal Yi to select one of the word lines WL0-WLn, or one of the bit lines BL0-BLm. The memory controller circuit 20 can also include a buffer memory 22, which can be used to temporarily store data intended to be written to the non-volatile memory 30 as well as the temporarily stored data read from the non-volatile memory 30.

A host system 10 is coupled to the memory controller 20 and can provide high level control on the memory controller circuit 20 to carry out read/write operations to the non-volatile memory 30. In particular, data and write commands from the host system 10 may be input to the memory controller 20. The memory controller 20 may control the non-volatile memory 30 to write the data into the cell array 32 in accordance with an input command, and/or control the non-volatile memory 30 to read data out of the cell array 32 in accordance with read commands from the host 10. Data transmitted between the host 10 and the flash memory 30 may be temporarily stored in the buffer memory 22. It will be understood that embodiments of the inventive concept described herein can be utilized to provide any of the circuitry shown in FIG. 1 as well as circuitry not shown.

Figure 2:
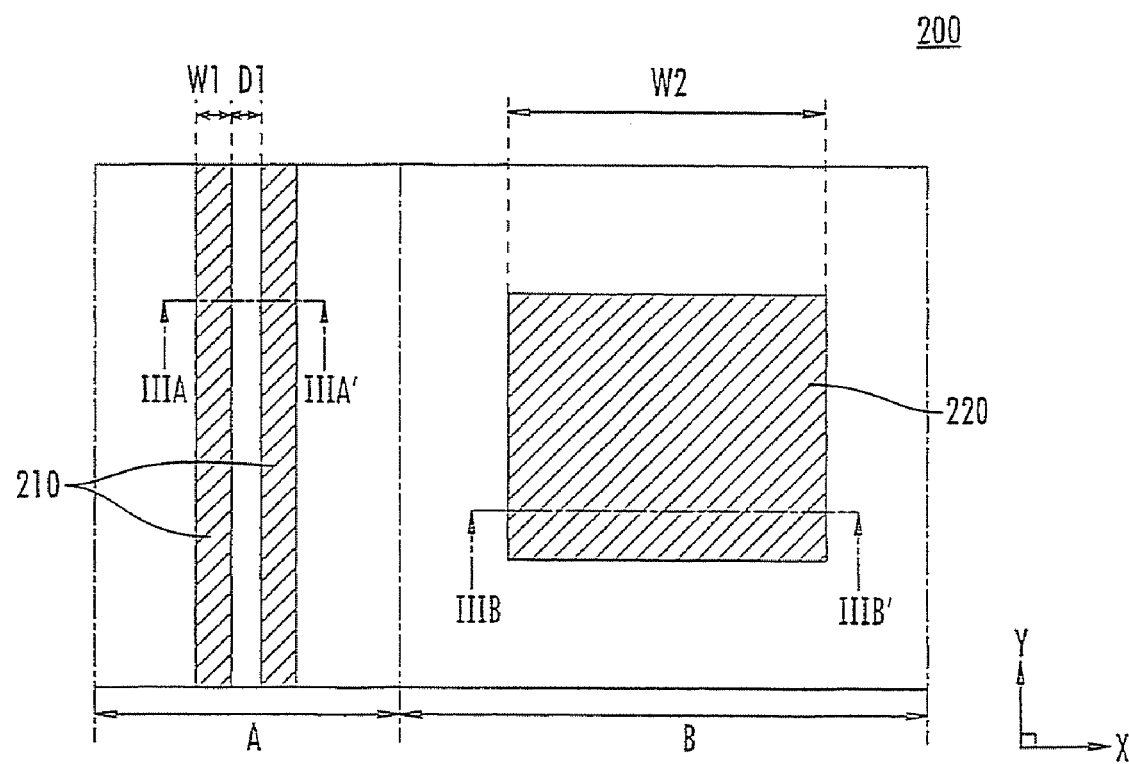
FIG. 2 is a plan view of a semiconductor substrate including two separate regions (A and B) having respective features formed thereon in some embodiments according to the inventive concept.

FIG. 2 is a plan view of a semiconductor device including two separate regions (A and B) having respective features formed thereon according to some embodiments of the inventive concept. In particular, region A of the semiconductor device 200 includes two features or patterns 210. Each feature 210 has a width W1, and the features 210 are separated by a distance D1. Furthermore, the separate region B of the semiconductor device 200 includes a feature or pattern 220 that has a width W2, which is different than the width W1 of the features 210 in region A.

In some embodiments, the region A can denote, for example, a cell array region of the device including relatively small features or patterns. In contrast, the region B can denote, for example, a peripheral core or another portion of the cell array region having features or patterns that are relatively large compared to those included in region A. In particular, the features 210 having a width W1 in region A can be relatively small compared to the feature 220 having a width W2 shown in region B. Furthermore, in some embodiments according to the inventive concept, the spacing D1 between the features 210 in region A can be the same as the width of those features or, alternatively, the spacing D1 between the features 210 may be less than the width W1 or greater than the width W1. The features 210 in region A may be active patterns or conductive patterns, such as conductive lines. The feature 220 in region B may be an active pattern or a conductive pattern, and in some embodiments, may be an alignment key. It will be further noted that the features 210 and 220 in the different regions may or may not be electrically connected to one another.

FIGS. 3a-3h are cross-sectional views illustrating methods of simultaneously forming a plurality of mask patterns using self aligned reverse patterning according to some embodiments of the inventive concept. In particular, preliminary structures 340A and 340B (referred to collectively herein as 340) are formed on underlying layers, which can include a etch mask layer 330 that is formed on a dual mask layer 320, which is in turn formed on a feature layer 310, all of which may be supported by a substrate 300 in both regions A and B of the device 200.

Figure 3A:
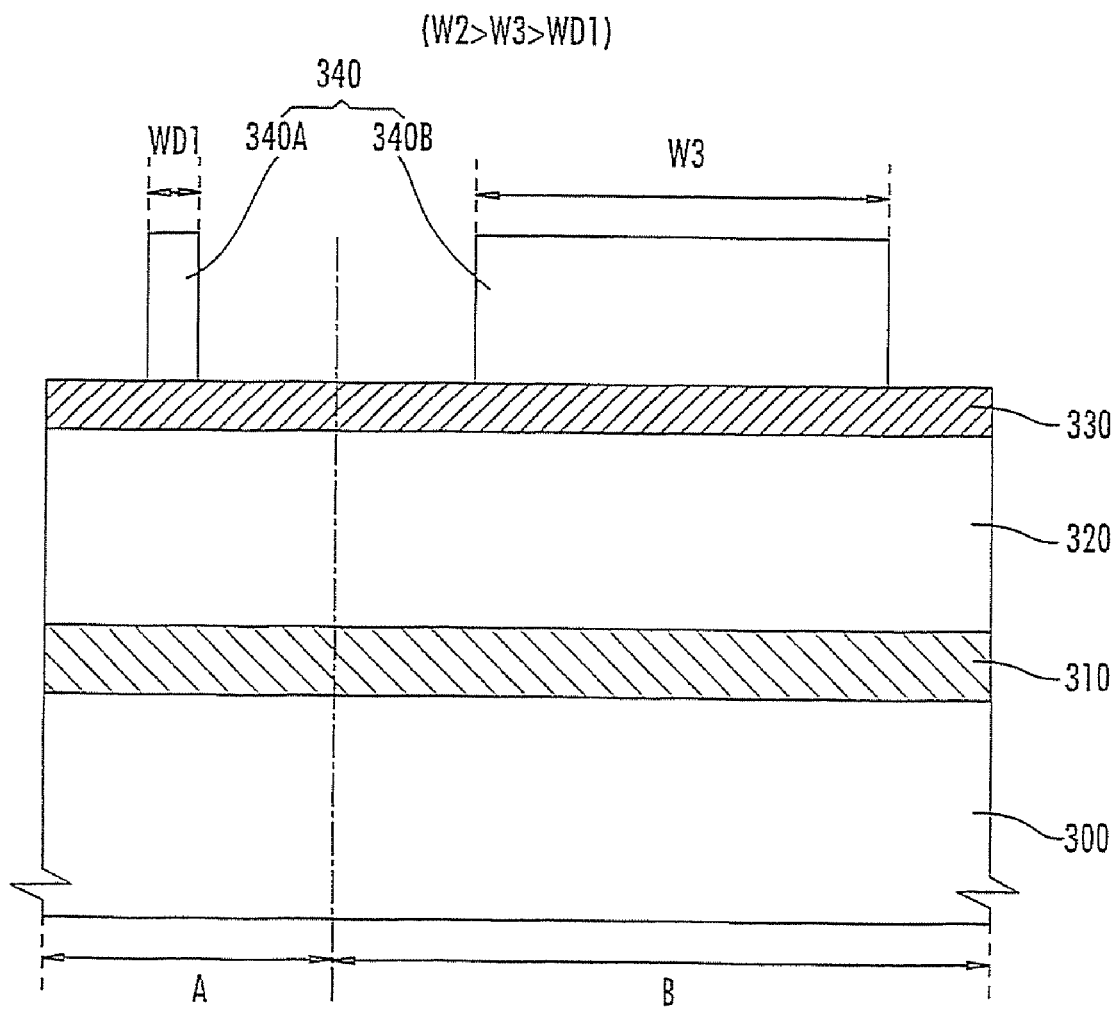
FIGS. 3a-3h are cross-sectional views illustrating methods of simultaneously forming a plurality of mask patterns using self aligned reverse patterning according to some embodiments of the inventive concept.

It will be understood that the layers shown in FIG. 3a can be formed of different material depending on the particular type of semiconductor device being formed. For example, if the preliminary structures 340 shown in FIG. 3a are being used to ultimately form conductive structures, such as gate electrodes, the feature layer 310 may be material, such as TaN, TiN, W, WN, HfN, $WSi_x$, and combinations thereof. Alternatively, if the features to be formed in the layer 310 are bitlines, the feature layer 310 may be formed of doped polysilicon, a metal, or a metal alloy such as tungsten or aluminum. As a further alternative, in some embodiments according to the inventive concept, when defining active regions or fine patterns in the substrate 300, the feature layer 310 may be eliminated, and the preliminary structures may be used at least initially to define trenches in the substrate 300. As shown in FIG. 3a, the preliminary structures 340 formed in regions A and B are formed to different widths WD1 and W3, respectively, where WD1 is less than W3, which, in turn, is less than the width W2 of the feature 220 that is formed in region B.

Still referring to FIG. 3a, the etch mask layer 330 can be formed of a material that has an etch selectivity relative to the dual mask layer 320. For example, in some embodiments according to the inventive concept, the etch mask layer 330 can be formed of SiON, $SiO_2$, $Si_3N_4$, SiCN, polysilicon, a metal, or an organic material. Further, in some embodiments according to the inventive concept, the preliminary structures 340A and 340B may be formed in a same step using a photolithography process.

As briefly described above, the dual mask layer 320 has an etch selectivity relative to the etch mask layer 330. Furthermore, the dual mask layer 320 can be formed of a material that contains silicon, such as $SiO_2$, $Si_3$, $N_4$, SiCN and/or polysilicon. In still further embodiments according to the inventive concept, the dual mask layer 320 may be formed of an amorphous carbon layer or a carbon-containing layer or a carbon containing material. The dual mask layer 320 may be applied to the feature layer 310 by a spin coating or CVD process. A portion of dual mask layer 320 formed in the region A can be used as a sacrificial layer for forming a plurality of etch mask patterns having multiple patterns. A portion of dual mask layer formed in the region B can be a portion of an etch mask for forming final patterns.

In some embodiments according to the inventive concept, when the dual mask layer 320 is formed of a carbon-containing material, the dual mask layer 320 may be formed of a hydrocarbon compound that includes an aromatic ring or an organic compound that includes a derivative thereof. For example, in some embodiments according to the inventive concept, the dual mask layer 320 can include an organic compound having an aromatic ring such as phenyl benzene, or naphthalene. In still further embodiments according to the inventive concept, the dual mask layer 320 may be a layer that has a relatively high carbon level (e.g., about 85% to about 99% by weight) based on the total weight of the organic compound.

Figure 3B:
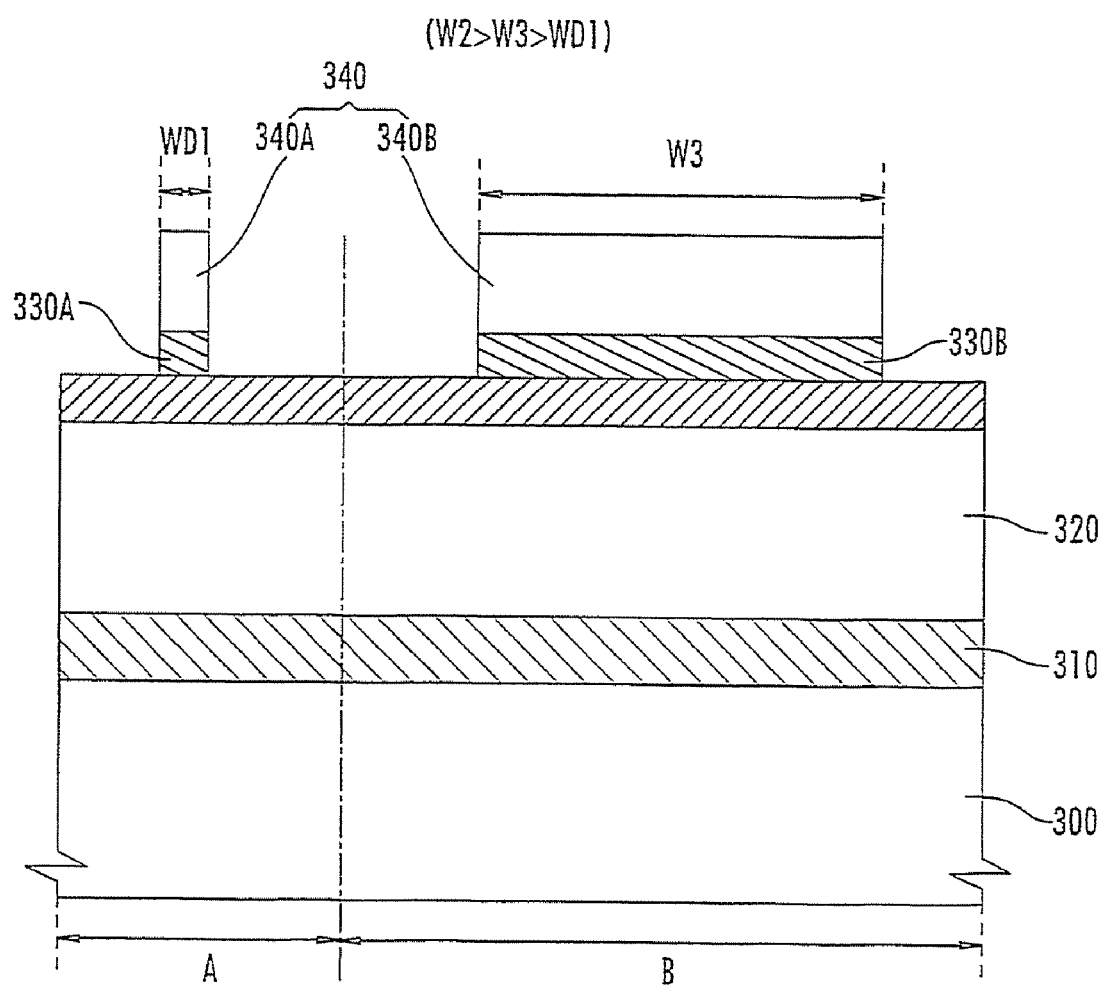
Figure 3C:
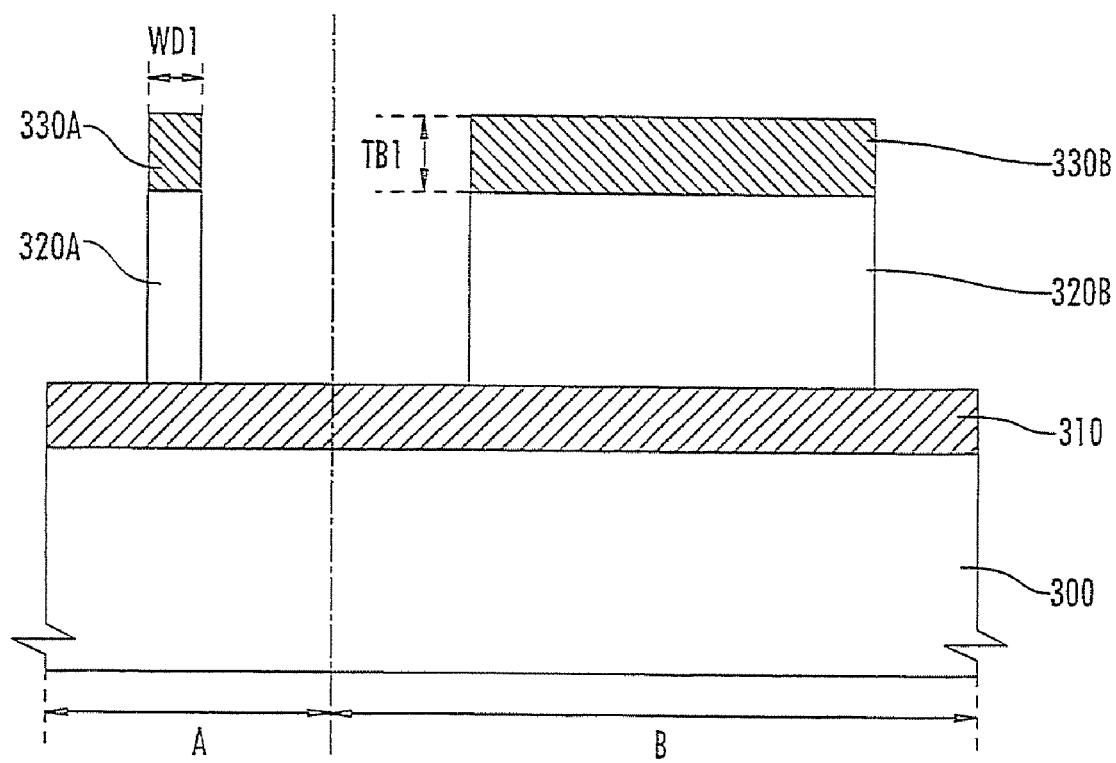
Figure 3D:
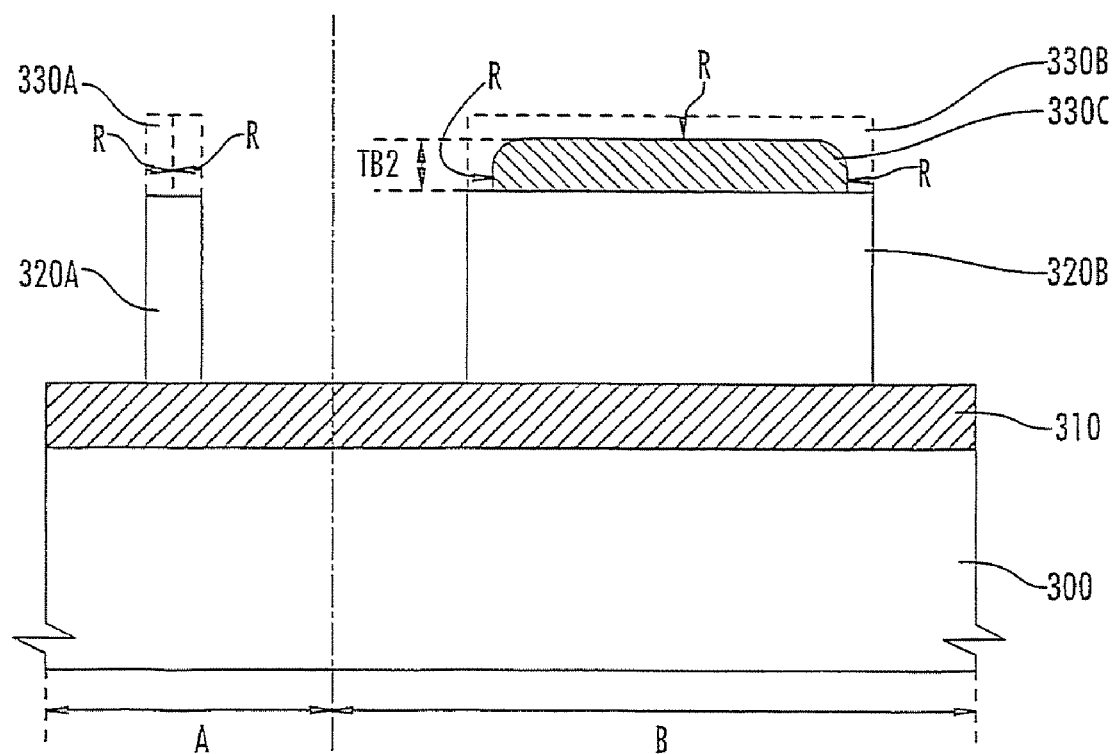
Figure 3E:
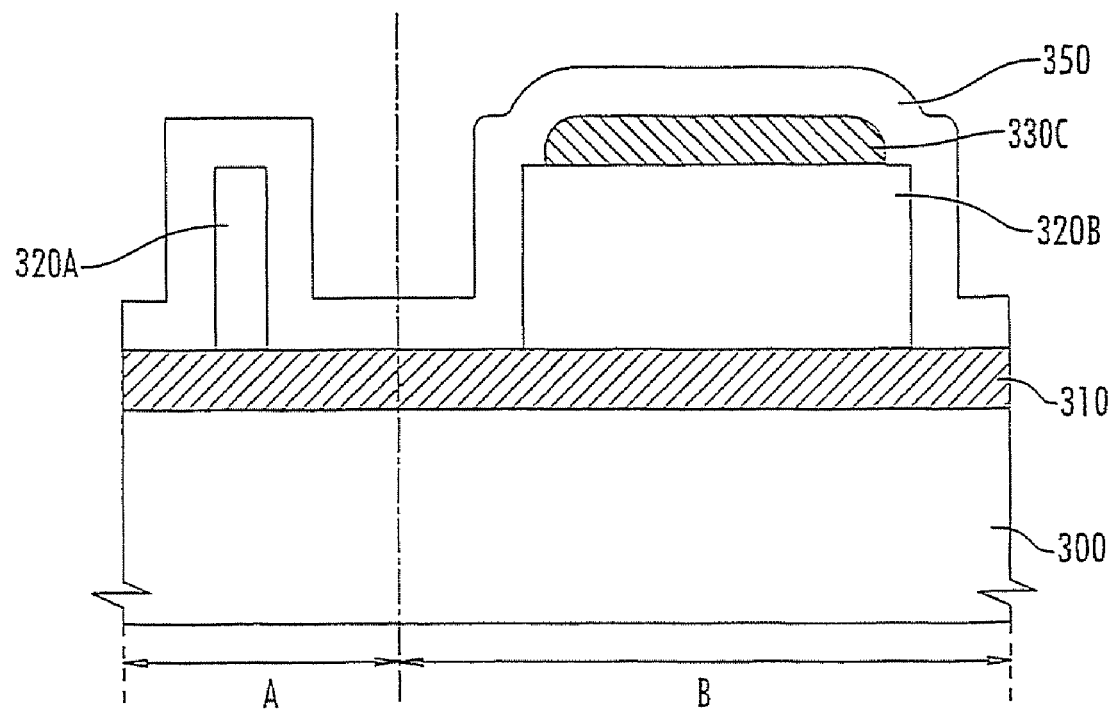
Figure 3F:
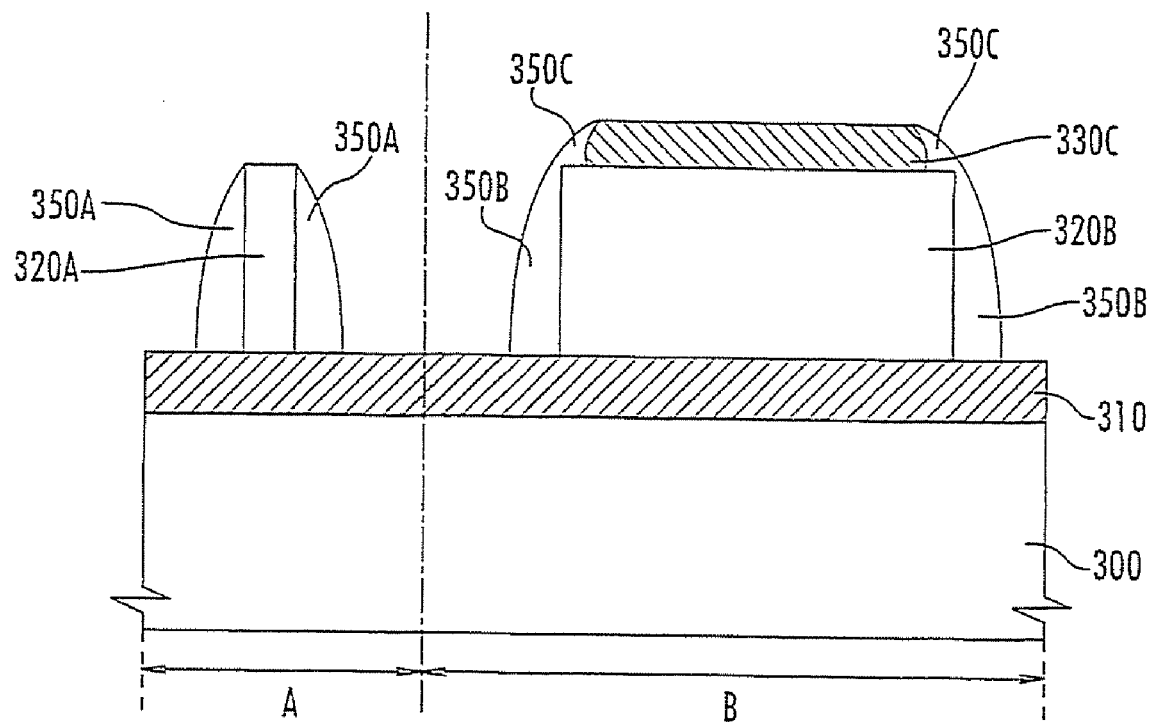
Figure 3G:
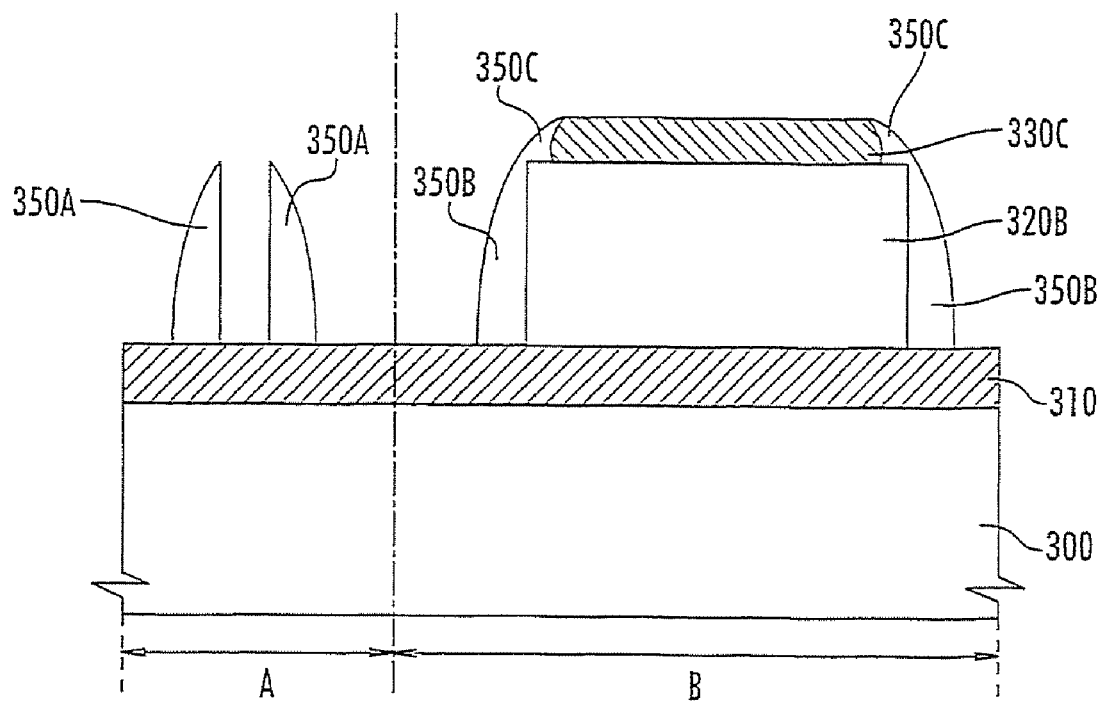
Figure 3H:
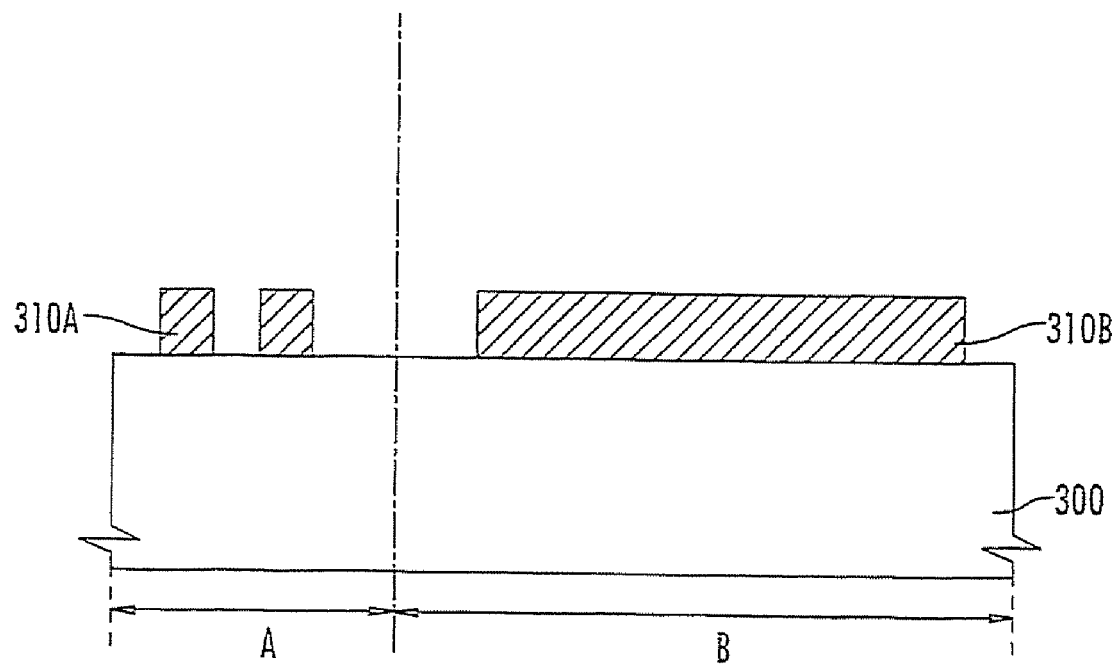
Figure 3I:
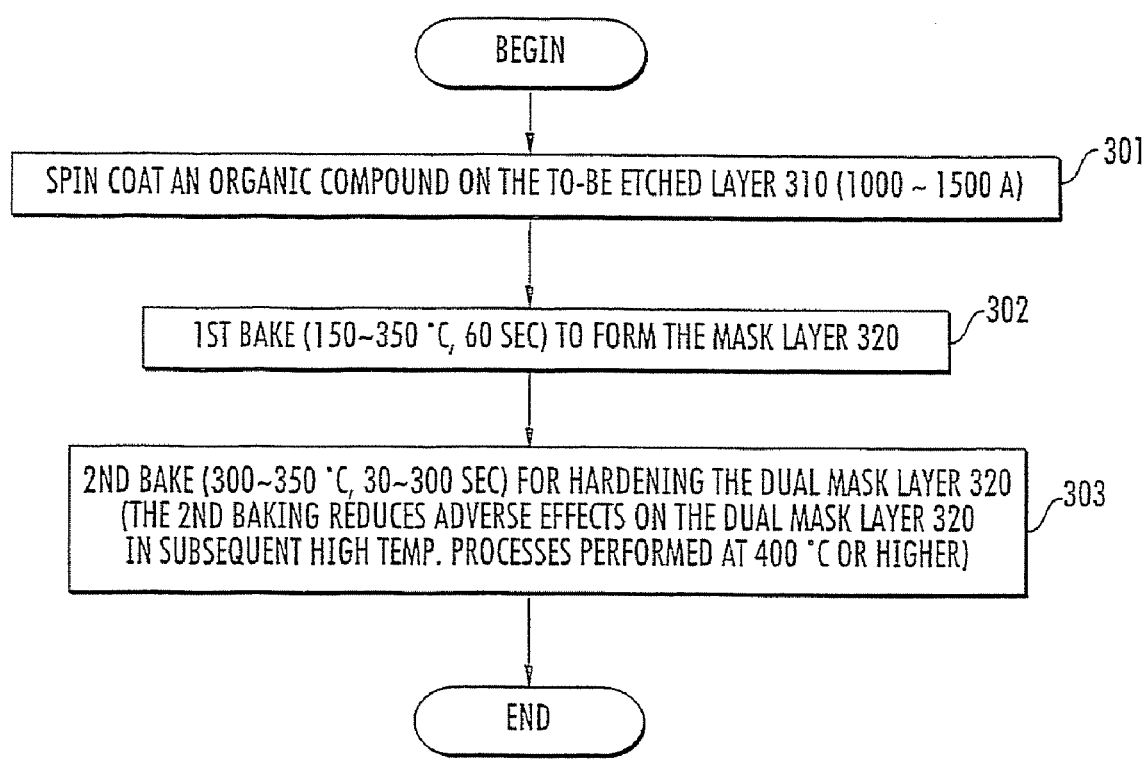
FIG. 3i is a flowchart illustrating methods of forming the dual mask layer on the feature layer in some embodiments according to the inventive concept.

FIG. 3i is a flowchart illustrating methods of forming the dual mask layer 320 on the feature layer 310 in some embodiments according to the inventive concept. According to FIG. 3i, an organic compound is spin coated onto the feature layer 310 (which is to be etched in a subsequent process) to a thickness of about 1000 angstroms (Å) to about 1500 Å (Block 301). The organic compound on the feature layer 310 is then baked at a temperature of about 150° centigrade to 350° centigrade for about 60 seconds to form the dual mask layer 320 (Block 302). A second bake is then performed on the dual mask layer 320 at a temperature of about 300° to about 550° for about 30 to about 300 seconds in order to harden the dual mask layer 320 (Block 303). The second bake process may help reduce adverse effects on the dual mask layer 320 that may otherwise be caused during subsequent steps in the fabrication of the semiconductor device when, for example, temperatures in excess of 400° centigrade may be applied to the device.

Referring now to FIG. 3b, following the formation of the preliminary structures 340 in FIG. 3a, the preliminary structures 340 are used to etch the underlying etch mask layer 330 to expose portions of the dual mask layer 320. As shown in FIG. 3b, the remaining portions of the etch mask layer 330A and 330B underlying the preliminary structures 340 conform to the profiles of the preliminary structures 340 and therefore have about the same width WD1 and W3 respectively. In some embodiments according to the inventive concept, the thickness of the preliminary structures 340 may be reduced during the etching of the etch mask layer 330.

As shown in FIG. 3c, the dual mask layer 320 is etched using the remaining portions of the etch mask layer 330A and 330B as a mask. The etching of the dual mask layer 320 is conducted to expose the underlying feature layer 310 and to define structure mask patterns 320A and 320B from the dual mask layer 320. During the etching of the dual mask layer 320, the preliminary structures 340 may be fully or partially removed. Also, after the etching of the dual mask layer 320, the thickness TB1 of the etch mask pattern 330B may be greater than half of the width WD1 of the etch mask pattern 330A, that is, TB1>(WD1)/2. The structure mask pattern 320A may be used as a sacrificial layer for forming fine features or patterns in region A, while the structure mask pattern 320B may be used as an etch mask to form features or patterns having a relatively larger width in region B. In some embodiments according to the inventive concept, the structure mask patterns 320A and 320B and the etch mask patterns 330A and 330B thereon define first and second mask structures in regions A and B that may be etched at different rates due to their differing widths.

More particularly, as shown in FIG. 3d, the etch mask pattern 330A in region A is completely removed using an isotropic etching process. The isotropic etching process of the etch mask patterns 330A and 330B may be conducted so as to provide a relatively high etch selectivity to the other exposed layers. Wet etching or dry etching may be used for the isotropic etching process. For example, if the etch mask layers 330A and 330B are formed of $SiO_2$ or SiON, a HF solution may be used to selectively isotropically etch the etch mask layers 330A and 330B.

However, because the first mask structure in region A is narrower than the second mask structure in region B, the etch mask pattern 330A may be etched at a faster rate than the etch mask pattern 330B. As such, the etch mask pattern 330A may be removed without completely removing the etch mask pattern 330B. In particular, the isotropic etching process may remove an amount R from each side of the etch mask pattern 330A, such that the etch mask pattern 330A may be completely removed from the structure mask pattern 320A. The isotropic etching process may similarly remove the amount R from the top and from each side of the etch mask pattern 330B, such that a portion of the etch mask pattern 330C remains on the structure mask pattern 320B. Accordingly, the remaining etch mask pattern 330C has a thickness TB2, which is less than the thickness TB1 of the etch mask pattern 330B.

As shown in FIG. 3e, a spacer mask layer 350 is conformally deposited on the structure mask patterns 320A and 320B, including on the remaining etch mask pattern 330C. Accordingly, the spacer layer 350 may directly contact the top of the structure pattern 320A. In some embodiments according to the inventive concept, the thickness of the spacer layer 350 may be about equal to the width W1 of the features 210 illustrated in FIG. 2. In other embodiments according to the inventive concept, the thickness of the spacer layer 350 is greater than or less than the width W1 of the features 210. The spacer mask layer 350 may have a different etch selectivity with respect to the remaining etch mask pattern 330C, the structure mask patterns 320A and 320B, and/or the feature layer 310.

According to FIG. 3f, portions of the spacer layer 350 are removed from the feature layer 310 as well as from the structure patterns 320A and 320B. In particular, in some embodiments, the spacer layer 350 may be etched back to expose surfaces of the first mask structure (which includes the structure mask pattern 320A) and the second mask structure (which includes the remaining etch mask pattern 330C). For example, in some embodiments according to the inventive concept, the etch back process applied to the spacer layer 350 can be carried out using a main etching gas of $C_xF_y$, where x and y are integers between 1 and 10. In other embodiments, the main etching gas can be $CH_xF_y$, where x and y are integers between 1 and 10. Also, in some embodiments, $O_2$ and/or Ar may be added to the main etching gas.

However, as shown in FIG. 3f, portions of the spacer layer remain on the structure patterns 320A and 320B and, particularly, on sidewalls thereof to provide opposing sidewall spacers 350A and 350B on structure patterns 320A and 320B, respectively. The spacers 350A may be used as an etch mask to form relatively fine features in region A, while the spacers 350B may be used as a part of etch mask to form relatively wide features in region B (e.g., having a width greater than those of the features in region A). As further shown in FIG. 3f, the opposing sidewall spacers 350B on structure pattern 320B fully cover the sidewalls of the structure pattern 320B, and extend above the structure pattern 320B to define spacers 350C that contact the sidewalls of the remaining etch mask pattern 330C.

In some embodiments according to the inventive concept, during the etch back of the spacer layer 350, polymer byproducts can be produced and deposited on the structure mask pattern 320A, the etch mask pattern 330C, and on the opposing sidewall spacers 350A and 350B. However, such polymer byproduct layers may be reduced or even eliminated based on the conditions associated with the etch back process. For example, the polymer byproduct layers may be affected by the amount of $O_2$ included in the main etching gas or alternatively, can be affected by the temperature applied during the etch back process. In particular, the polymer byproduct layer may be reduced or even eliminated by decreasing the amount of $O_2$ or by lowering the process temperature.

Referring now to FIG. 3g, the structure mask pattern 320A is selectively removed from between the spacers 350A. For example, the surfaces of the first mask structure (which includes the structure mask pattern 320A) and the second mask structure (which includes the remaining etch mask pattern 330C and the structure mask pattern 320B) that are exposed by the sidewall spacers 350A and 350B may be etched using a selective etching process such that the portion of the self aligned reverse mask pattern 320A is removed from between the opposing sidewalls 350A so that the underlying portion of the feature layer 310 is exposed. However, the structure mask pattern 320B in region B may remain (without a significant loss in thickness) despite the removal of structure mask pattern 320A. In particular, the remaining etch mask pattern 330C as well as opposing sidewall spacers 350B and 350C protect the underlying structure 320B from the process used to remove the structure mask pattern 320A. In some embodiments, even if the spacers 350C were not formed, the structure mask pattern 320B may not be substantially removed, and thus, may provide a sufficient thickness to be used as an etch mask for etching the underlying feature layer 310 in a subsequent process.

Accordingly, a plurality of self aligned reverse mask patterns are simultaneously formed in both region A and region B, where some of the respective mask pattern elements are narrower than others. More particularly, as shown in FIG. 3g, the opposing sidewall spacers 350A define narrower ones of the self aligned reverse mask pattern, which have respective widths that are less than that of the self aligned reverse mask pattern defined by the opposing sidewall spacers 350B and 350C, the structure mask pattern 320B that separates the opposing sidewall spacers 350B, and the remaining etch mask pattern 330C thereon.

Thus, as shown in FIG. 3h, the self aligned reverse mask patterns found in region A (e.g., the spacers 350A) and region B (e.g., the spacers 350B and 350C, the structure mask pattern 320B, and the remaining etch mask pattern 330C) are utilized as a mask to etch the underlying feature layer 310 to define features or patterns 310A in region A, and features or patterns 310B of differing width in region B. As described above, these features can be any component used in a semiconductor device such as conductive components found in gates, etc. For example, the features 310A and 310B may correspond to the features 210 and 220 illustrated in FIG. 2, respectively.

Figure 4:
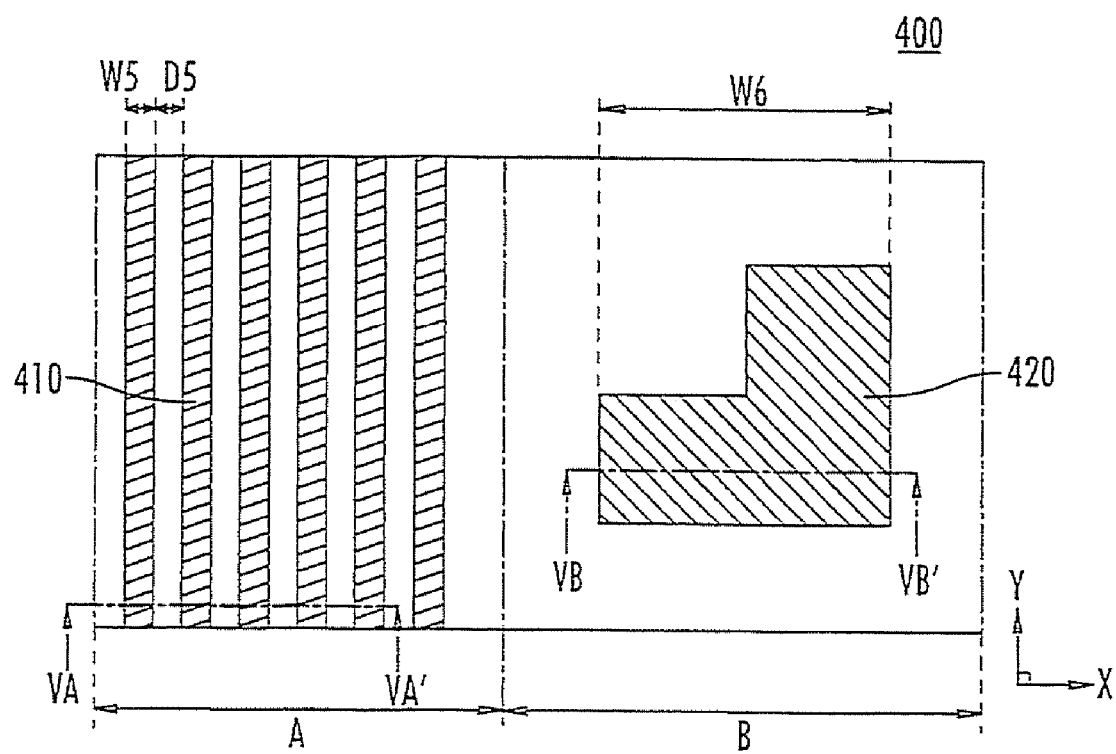
FIG. 4 is a plan view of a semiconductor device according to some embodiments of the inventive concept.

FIG. 4 is a plan view of a semiconductor device 400 where elements 410 shown in region A have widths W5 and are separated by spacing D5, and where element 420 in region B has a width W6 according to some embodiments of the inventive concept. In some embodiments, the region A can denote, for example, a cell array region of the device including relatively small features or patterns. In contrast, the region B can denote, for example, a peripheral core or another portion of the cell array region having features or patterns that are relatively large compared to those included in region A. In particular, the features 410 having a width W5 in region A can be relatively small compared to the feature 420 having a width W6 shown in region B. Furthermore, in some embodiments according to the inventive concept, the spacing D5 between the features 410 in region A can be the same as the width W5 of those features or, alternatively, the spacing D5 between the features 410 may be less than the width W5 or greater than the width W5. The features 410 in region A may be active patterns or conductive patterns, such as conductive lines. The feature 420 in region B may be an active pattern or a conductive pattern. It will be further noted that the features 410 and 420 in the different regions may or may not be electrically connected to one another.

FIGS. 5a-5f are cross-sectional views that illustrate methods of forming STI regions in substrate by simultaneously forming a plurality of mask patterns used in self aligned reverse patterning in some embodiments according to the inventive concept. According to FIG. 5a, a preliminary pattern 340' (including elements 340A' and 340B') is formed on an etch mask layer 330', which is formed on a dual mask layer 320' formed on a buffer mask layer 510 that is formed on a second hard mask layer 506 on a first hard mask layer 504 on a pad oxide layer 502, all of which are located on the substrate 500. The mask pattern elements 340A' may have a width WD2, while the mask pattern element 340B' may have a width W7, which is greater than WD2 but less than the width W6 of the feature 420 of FIG. 4. The pitch between adjacent mask pattern elements 340A' may be 2 P.

It will be understood that the hard mask layers 504 and/or 506 can be a single layer that includes only one material, or may be a multi-layer structure including two or more material layers. The hard mask layers 504 and 506 may also have different etch selectivities. In some embodiments according to the inventive concept, the buffer mask layer 510 can have an etch selectivity relative to the hard mask layer 506. However, in other embodiments, the buffer mask layer 510 can be omitted.

Figure 5A:
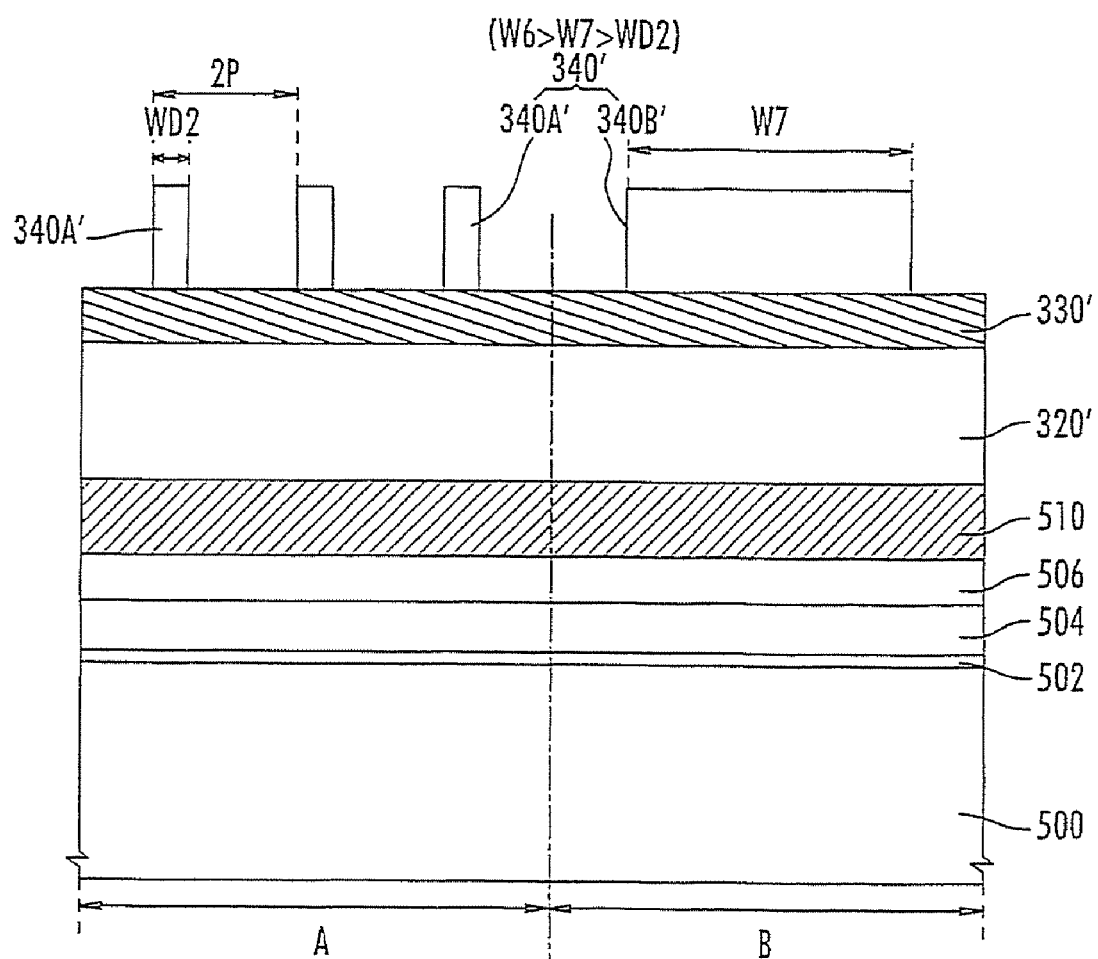
FIGS. 5a-5f are cross-sectional views that illustrate methods of forming STI regions in substrate by simultaneously forming a plurality of mask patterns used in self aligned reverse patterning in some embodiments according to the inventive concept.
Figure 5B:
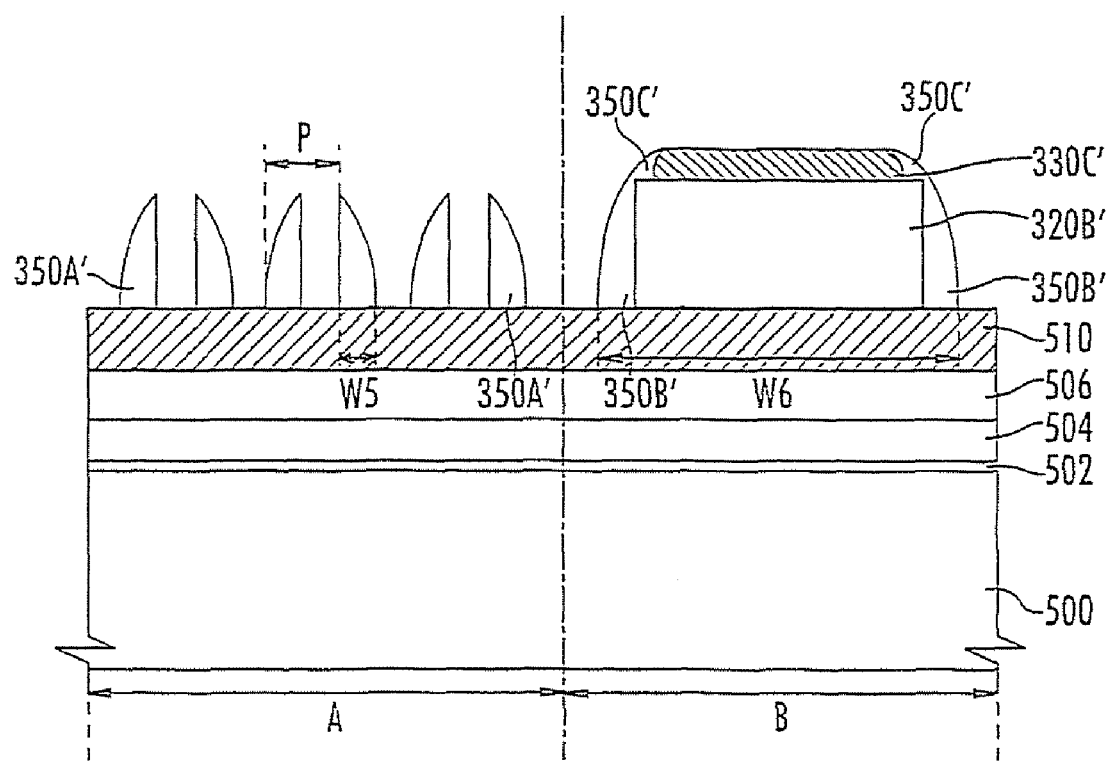

As shown in FIG. 5b, mask patterns (including mask elements 350A' in region A and mask elements 320B', 330C', 350B', and 350C' in region B) are formed on the buffer mask layer 510. In particular, the elements of the mask patterns in regions A and B can be formed as described above with reference to FIGS. 3a-3h. The mask pattern including the spacers 350B' and 350C' and the structure 320B' and a etch mask layer 330C' thereon is formed in region B to have an overall width W6 that is greater than the width W5 of the sidewall spacers 350A' formed in region A.

Figure 5C:
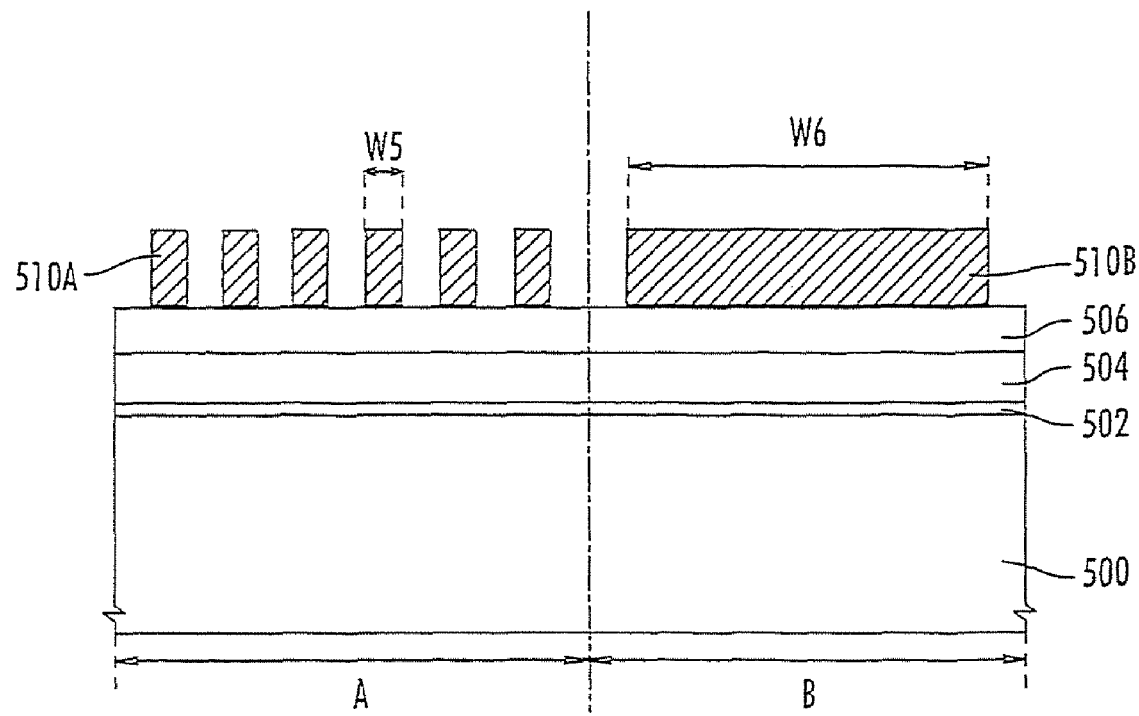

According to FIG. 5c, the elements in the mask patterns in regions A and B are used as an etch mask to form elements 510A and 510B in regions A and B, respectively. In particular, the buffer mask layer 510 is patterned using the spacers 350A' in region A and the spacers 350B' and 350C', the structure 320B', and the remaining etch mask layer 330C' in region B as masks to define the buffer mask patterns 510A and 510B. The width of the buffer mask patterns 510A formed in region A is W5, and the width of the buffer mask patterns 510B formed in region B is W6, which is wider than W5.

Figure 5D:
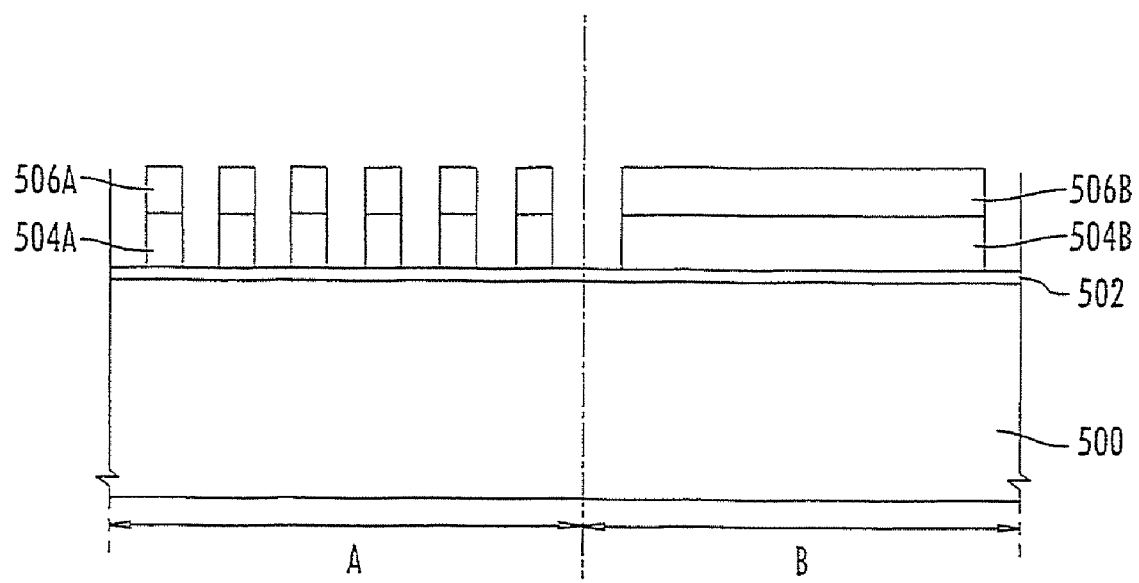

As shown in FIG. 5d, the elements 510A and 510B are used to etch the hard mask layers 506 and 504 to provide hard mask patterns including layers 506A and 504A in region A, and a hard mask pattern including layers 506B and 504B in region B, beneath which portions of the pad oxide layer 502 are exposed.

Figure 5E:
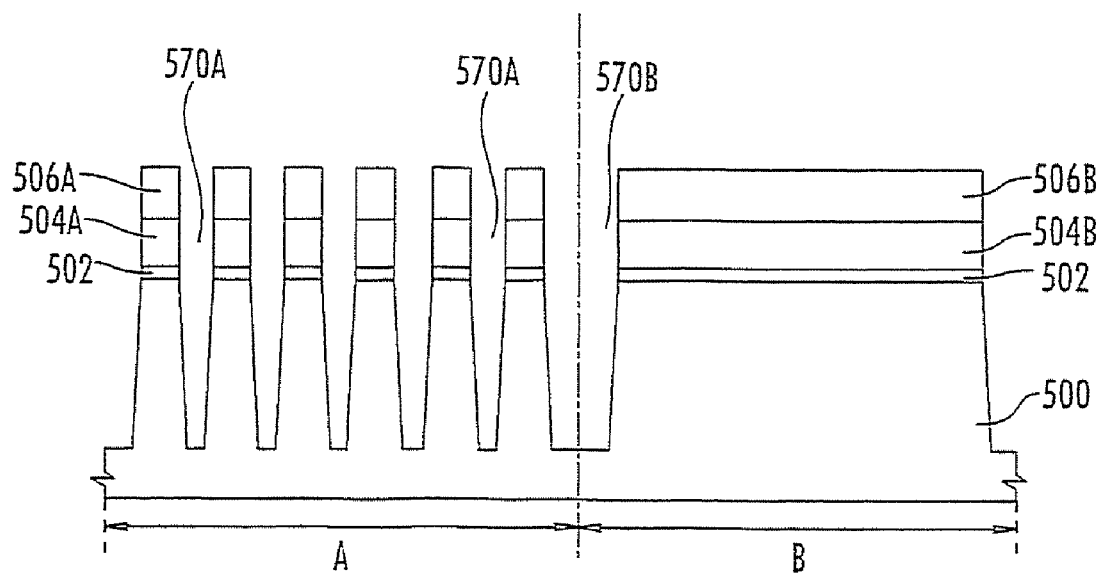

According to FIG. 5e, the hard mask patterns 506A/504A and 506B/504B are used as an etch mask to etch through the exposed portions of the pad oxide layer 502 and into the substrate 500 to form isolation trenches 570A in region A and 570B in region B.

Figure 5F:
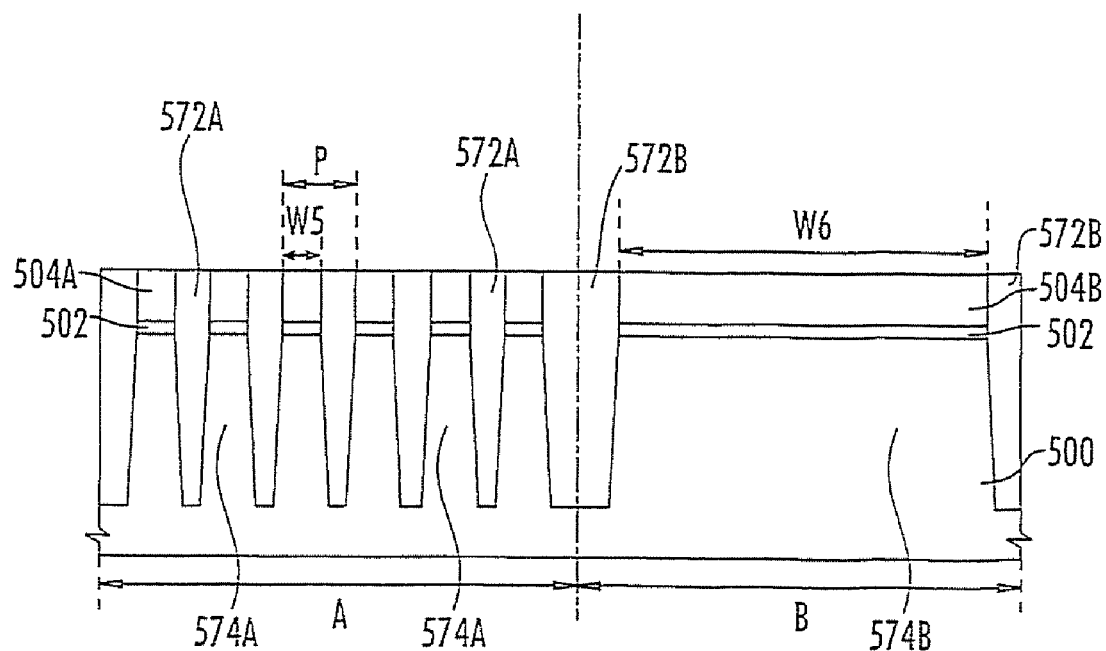

As shown in FIG. 5f, an insulating material is formed in the trenches 570A and 570B to form STI regions 572A and 572B in regions A and B, respectively. Furthermore, active regions 574A and 574B are defined between immediately adjacent isolation regions 572A and 572B, each of which can have the width W5 and W6, respectively. The active regions 574A and 574B may correspond to the features/patterns 410 and 420 of FIG. 4, respectively. Furthermore, FIG. 5f illustrates that the pitch between the adjacent active areas can be P.

FIGS. 6a-6h are cross-sectional views illustrating methods of forming STI regions according to further embodiments of the inventive concept. According to FIG. 6a, a preliminary pattern 340" (including elements 340A" and 340B") is formed on an etch mask layer 330", which is formed on a dual mask layer 320" formed on a buffer mask layer 510' that is formed on a second hard mask layer 506' on a first hard mask layer 504' on a pad oxide layer 502', all of which are located on the substrate 500'. The mask pattern elements 340A" may have a width WD2. The pitch between adjacent mask pattern elements 340A" may be 2 P.

It will be understood that the hard mask layers 504' and/or 506' can be a single layer that includes only one material, or may be a multi-layer structure including two or more material layers. The hard mask layers 504' and 506' may also have different etch selectivities. In some embodiments according to the inventive concept, the buffer mask layer 510' can have an etch selectivity relative to the hard mask layer 506'. However, in other embodiments, the buffer mask layer 510' can be omitted.

Figure 6A:
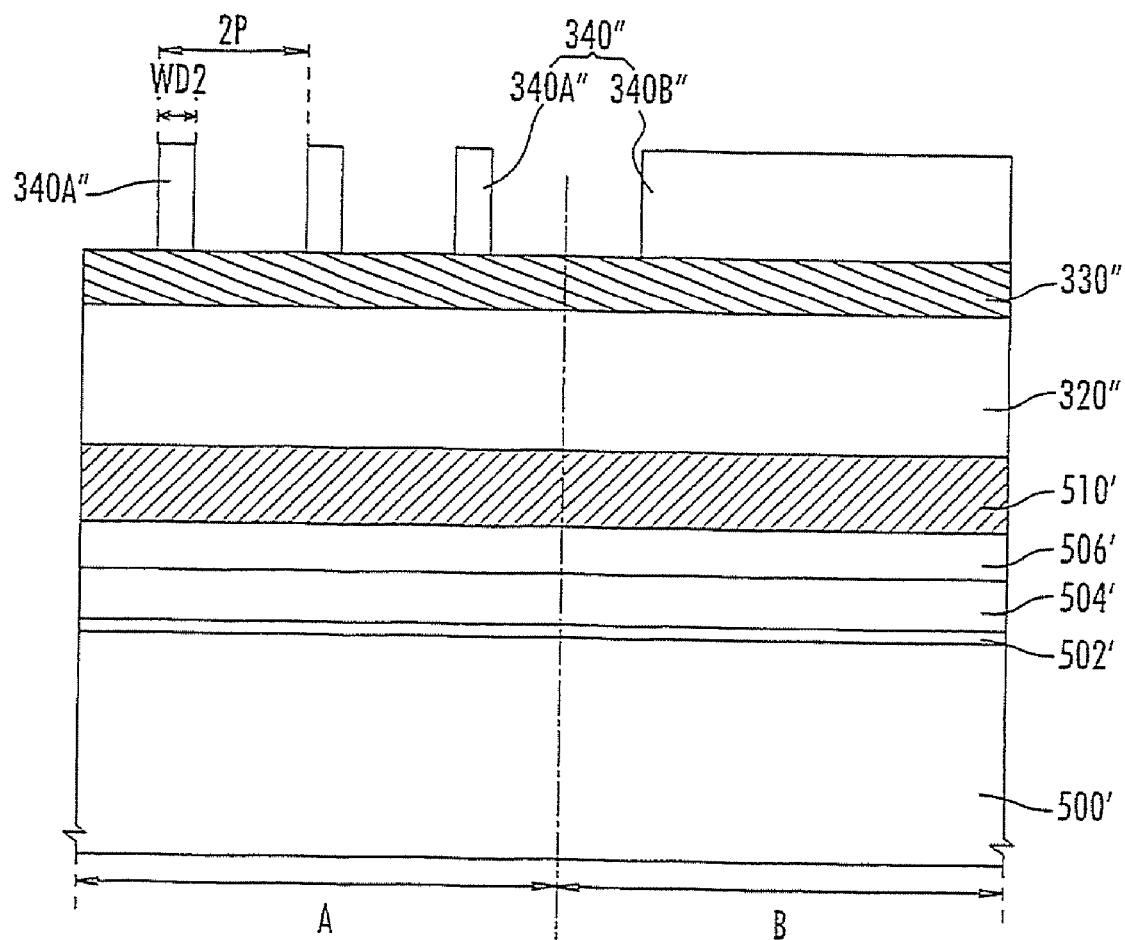
FIGS. 6a-6h are cross-sectional views illustrating methods of forming STI regions according to further embodiments of the inventive concept.
Figure 6B:
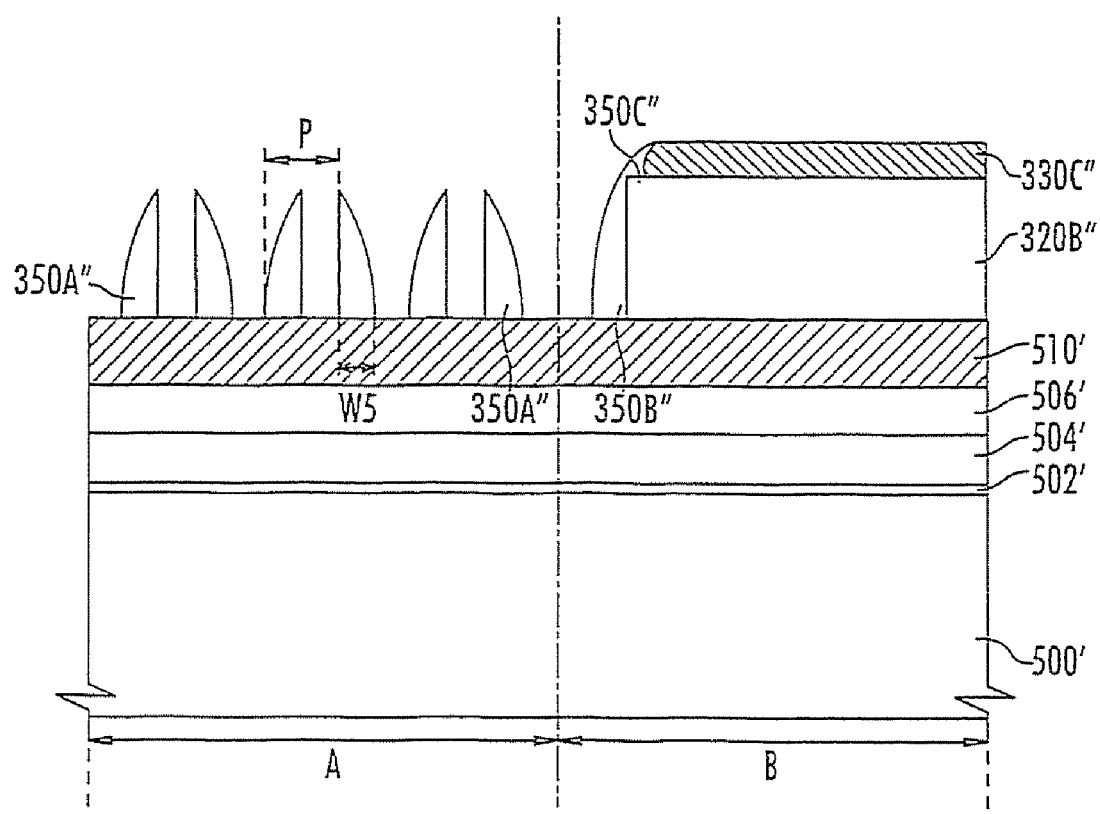

As shown in FIG. 6b, mask patterns (including mask elements 350A" in region A and mask elements 320B", 330C", 350B", and 350C" in region B) are formed on the buffer mask layer 510'. In particular, the elements of the mask patterns in regions A and B can be formed as described above with reference to FIGS. 3a-3h. The mask pattern including the opposing sidewall spacers 350B" and the structures 320B" and a etch mask layer 330C" thereon is formed in region B to have an overall width that is greater than the width W5 of the spacers 350A" formed in region A.

Figure 6C:
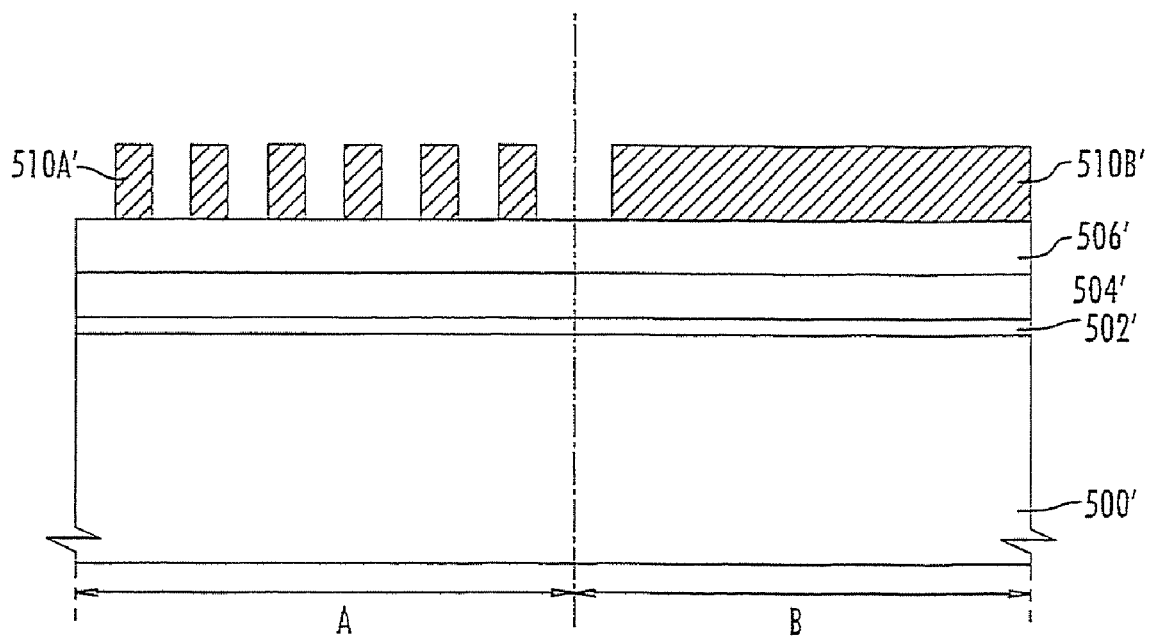

According to FIG. 6c, the elements in the mask patterns in regions A and B are used as an etch mask to form elements 510A' and 510B' in regions A and B, respectively. In particular, the buffer mask layer 510' is patterned using the spacers 350A" (in region A) and the spacers 350B" and 350C", the structure 320B", and the remaining etch mask layer 330C" (in region B) as masks to define the buffer mask patterns 510A' and 510B'.

Figure 6D:
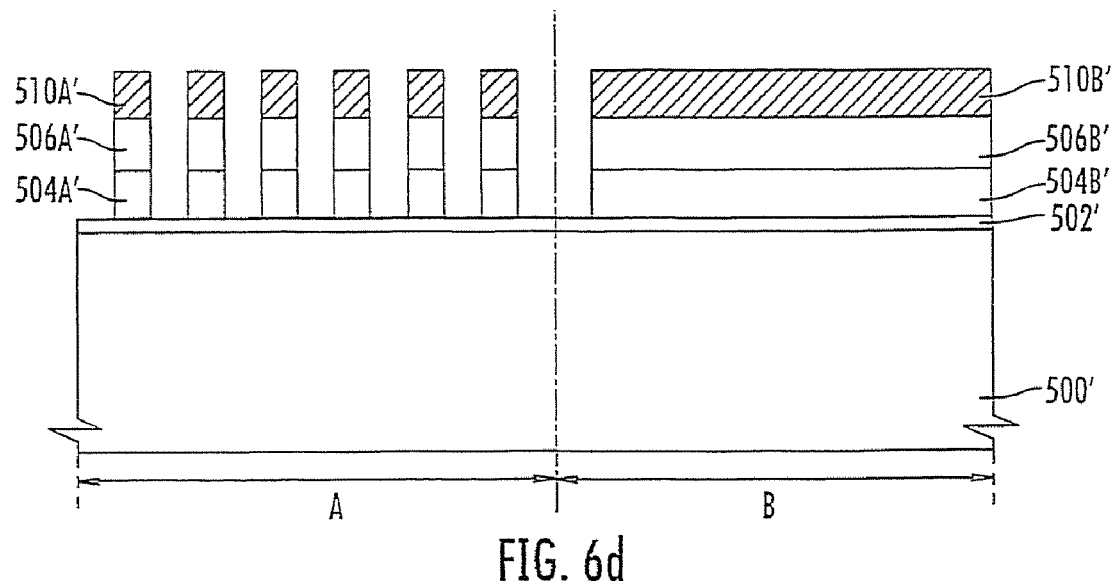

As shown in FIG. 6d, the elements 510A' and 510B' are used to etch the hard mask layers 506' and 504' to provide a hard mask pattern including layers 506A' and 504A' in region A, and layers 506B' and 504B' in region B, beneath which portions of the pad oxide layer 502' are exposed.

Figure 6E:
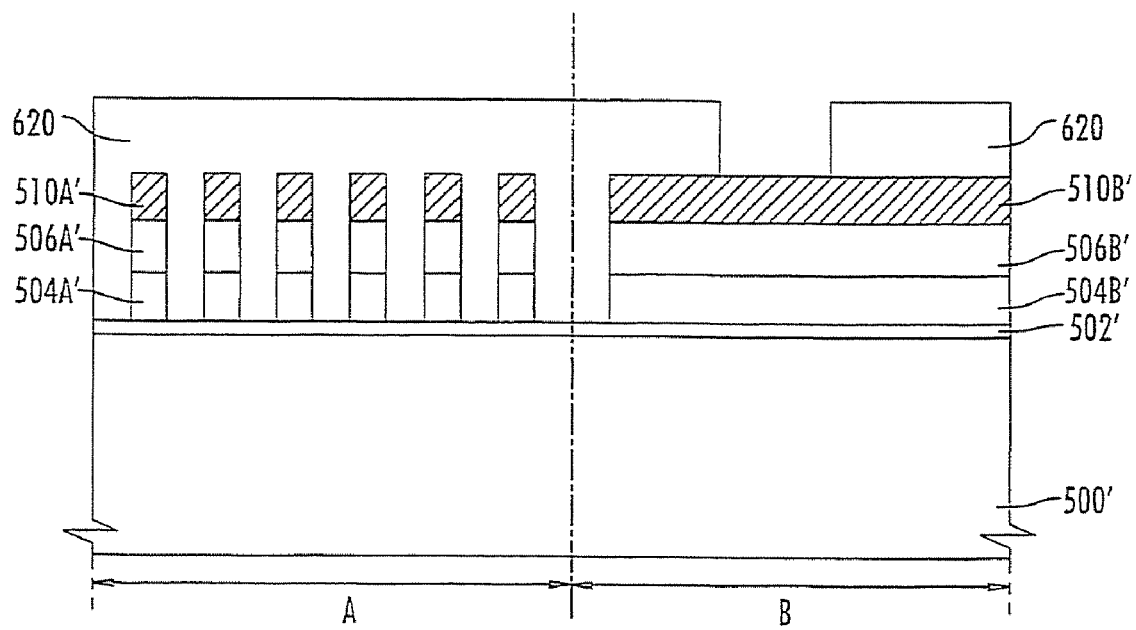

According to FIG. 6e, a wide trench mask pattern 620 is formed on the hard mask pattern 506A'/504A'/510A' in region A and 506B'/504B'/510B' in region B. The trench mask pattern 620 includes an opening therein exposing a surface of the buffer mask pattern 510B'.

Figure 6F:
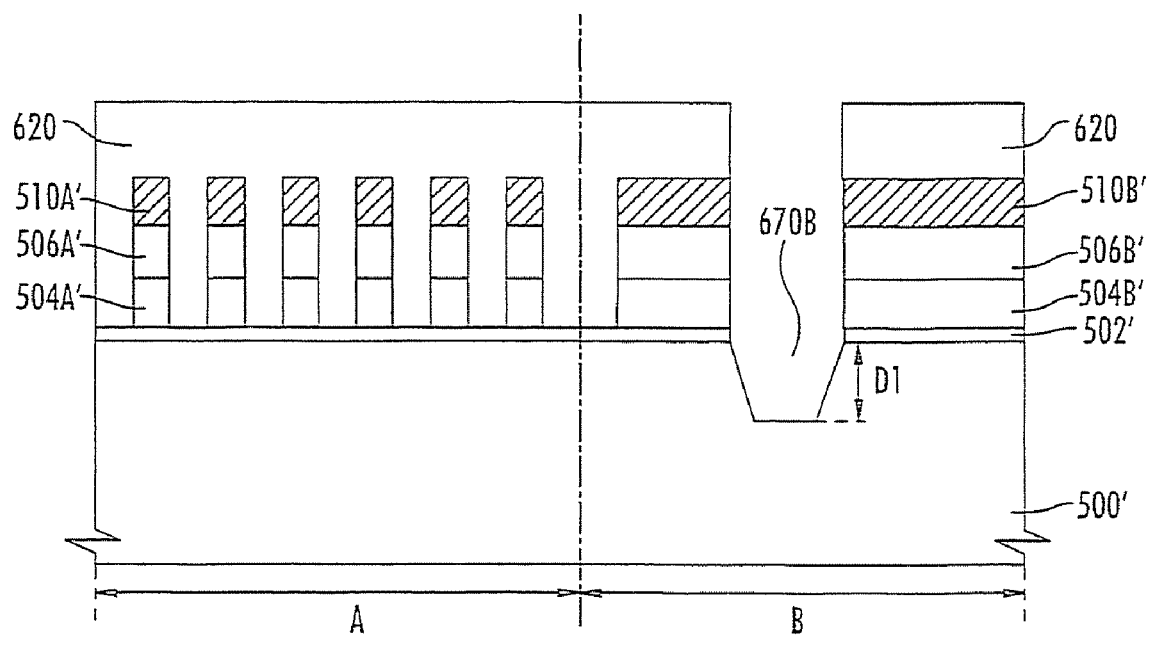

As shown in FIG. 6f, the trench mask pattern 620 is used as an etch mask to etch through the exposed surface of the buffer mask pattern 510B', the layers 506B' and 504B' of the hard mask pattern, the pad oxide layer 502', and into the substrate 500' to form a precursor isolation trench 670B in region B. The precursor isolation trench 670B extends into the substrate 500' to a depth D1.

Figure 6G:
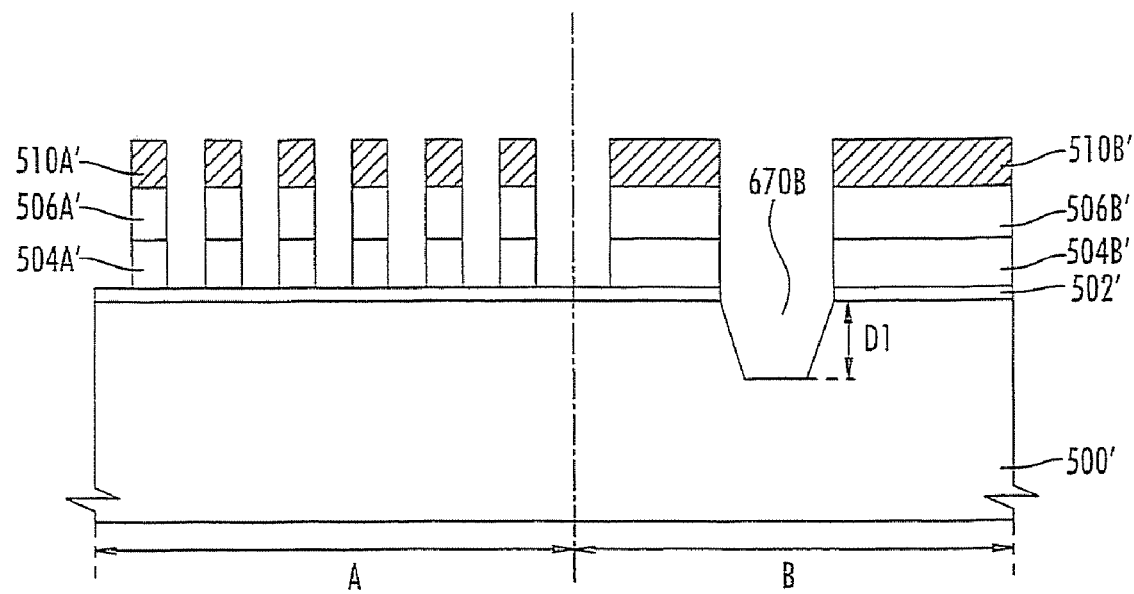
Figure 6H:
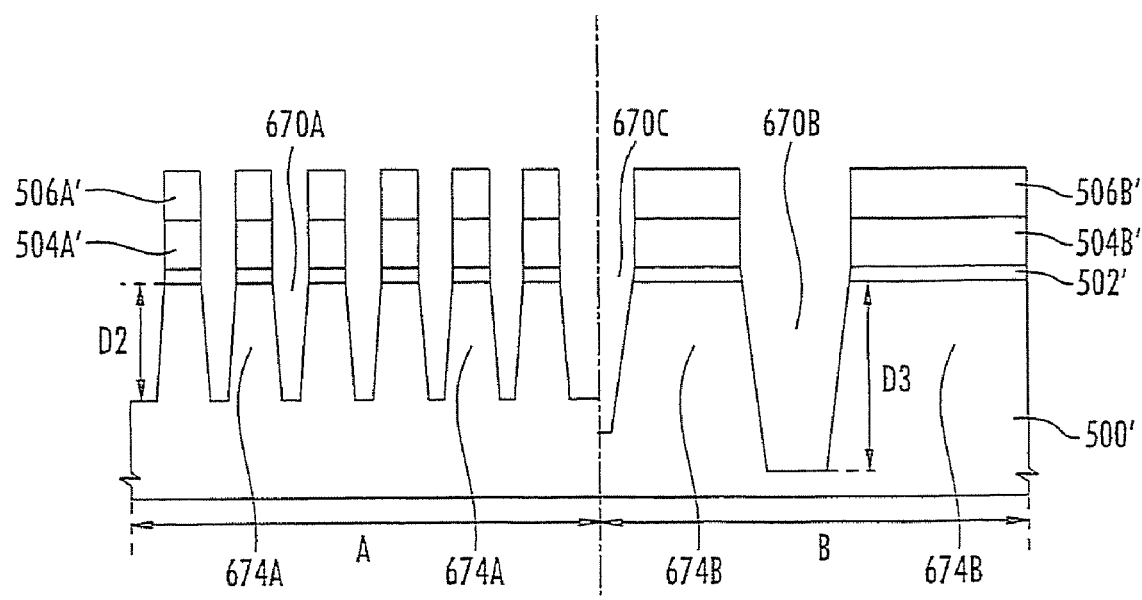

According to FIG. 6g, the trench mask pattern 620 is removed from regions A and B after forming the precursor isolation trench 670B in region B. As shown in FIG. 6h, the hard mask patterns 506A'/504A' and 506B'/504B' are used as an etch mask to etch the exposed portions of the pad oxide layer 502' and into the substrate 500' to define isolation trenches 670A in region A, isolation trenches 670C in region B, and to increase the depth of the trench 670B in region B. Active regions 674A and 674B are defined between immediately adjacent trenches 670A and 670B, respectively. The depth D3 of the trench 670B in region B is greater than the depth D2 of the trenches 670A in region A. However, in region B, various patterns may be spaced apart from each other by various distances, and trenches of various depths may be formed. Accordingly, as shown in FIG. 6h, the depth of the trench 670C in region B is less than the depth D3 of the trench 670B in region B. STI regions (not shown) may be formed by depositing an insulating material in the trenches 670A, 670B, and/or 670C, as similarly discussed above with reference to FIG. 5f.

Figure 7:
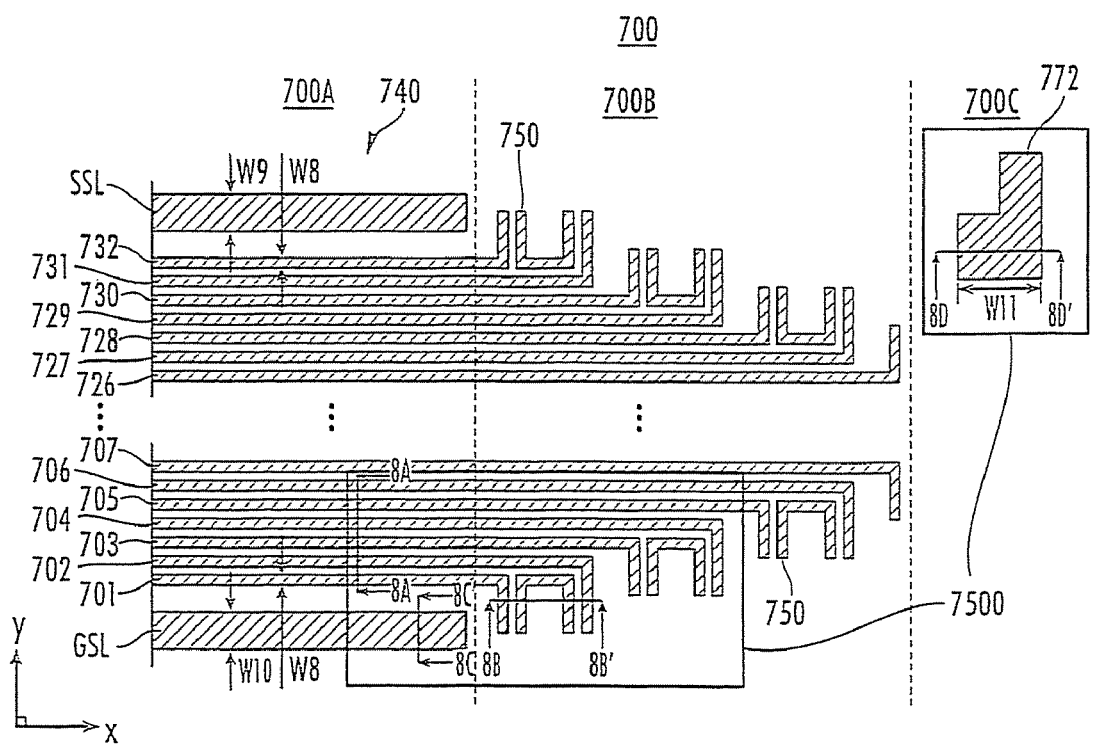
FIG. 7 is a plan view that illustrates a NAND flash device formed in accordance with some embodiments of the inventive concept.

FIG. 7 is a plan view that illustrates a NAND flash device formed in accordance with some embodiments of the inventive concept. Furthermore, highlighted portions 7500 include various cross sectional views illustrated in subsequent figures in some embodiments according to the inventive concept. Still referring to FIG. 7, the NAND device 700 includes a cell array region 700A including NAND flash type cells. The region 700B corresponds to a contact region for the NAND flash device, which may be. The region 700C corresponds to a peripheral region of the flash device. Further, the regions 740 corresponds to a cell block region wherein elements 701-732 correspond to a plurality of conductive lines, such as word lines. However, the plurality of conductive lines 701-732 may be bit lines in some embodiments, and the string select lines SSL and/or ground select lines GSL may be omitted. The regions 750 corresponds to dummy conductive lines such as word lines, bit lines, or metal lines in some embodiments according to the inventive concept. Element 772 corresponds to conductive patterns for a peripheral circuit in some embodiments according to the inventive concept. The region 700B may be used to connect conductive lines 701-732 to external circuits such as decoders in some embodiments according to the inventive concept.

Figure 8A:
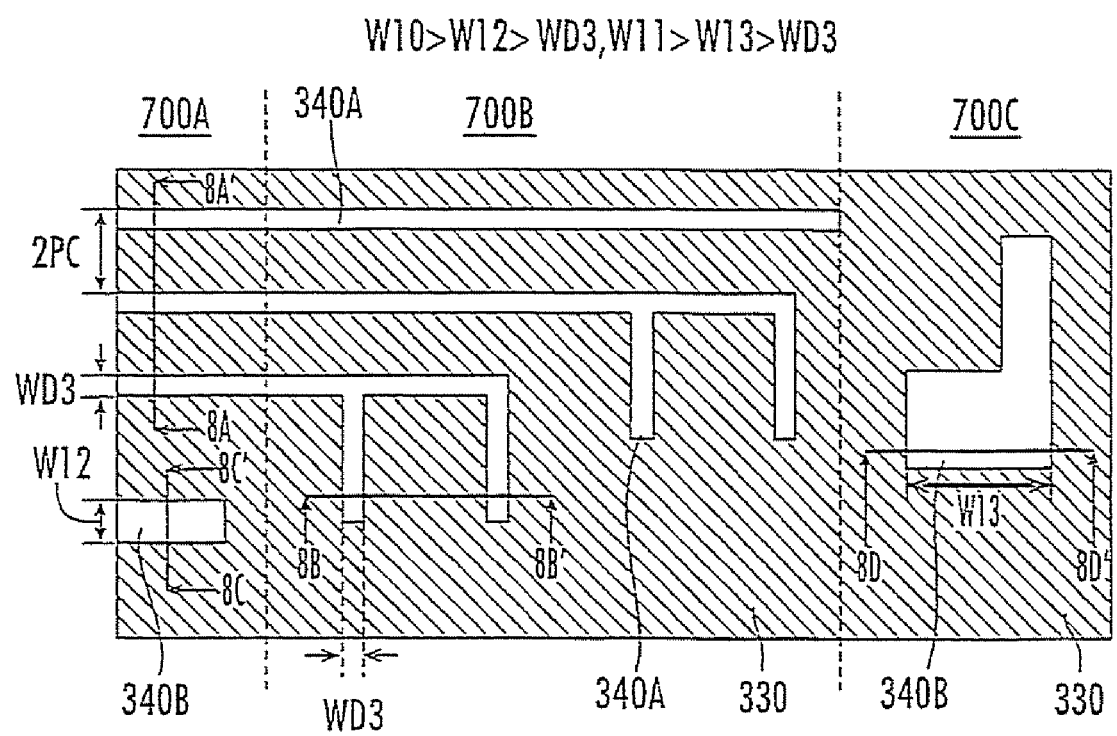

FIGS. 8a-14b are alternating plan and cross-sectional views of the highlighted portions 7500 of the semiconductor device 700 of FIG. 7 illustrating methods of simultaneously forming a plurality of mask patterns using self aligned reverse patterning in accordance with some embodiments of the inventive concept. As shown in FIGS. 8a-8b, element 800 corresponds to a substrate on which the flash memory devices can be formed, element 830 corresponds to conductive lines to which may be formed of materials TaN, TiN, W, N, HfN, WSi$_x$ and/or combinations thereof. In some embodiments, the elements 830 may be bitlines, and may be formed of polysilicon, metal, and/or metal alloys. Element 832 corresponds to a hard mask layer, which may be either a single layer comprising one material or multiple layers each comprising separate material layers. Element 834 corresponds to a buffer mask layer having a different etch selectivity relative to the hard mask layer 832. Element 320 corresponds to a dual mask layer, element 330 corresponds to an etch mask layer, and element 340 (which includes 340A and 340B) corresponds to a preliminary mask pattern in some embodiments according to the inventive concept.

Figure 8B:
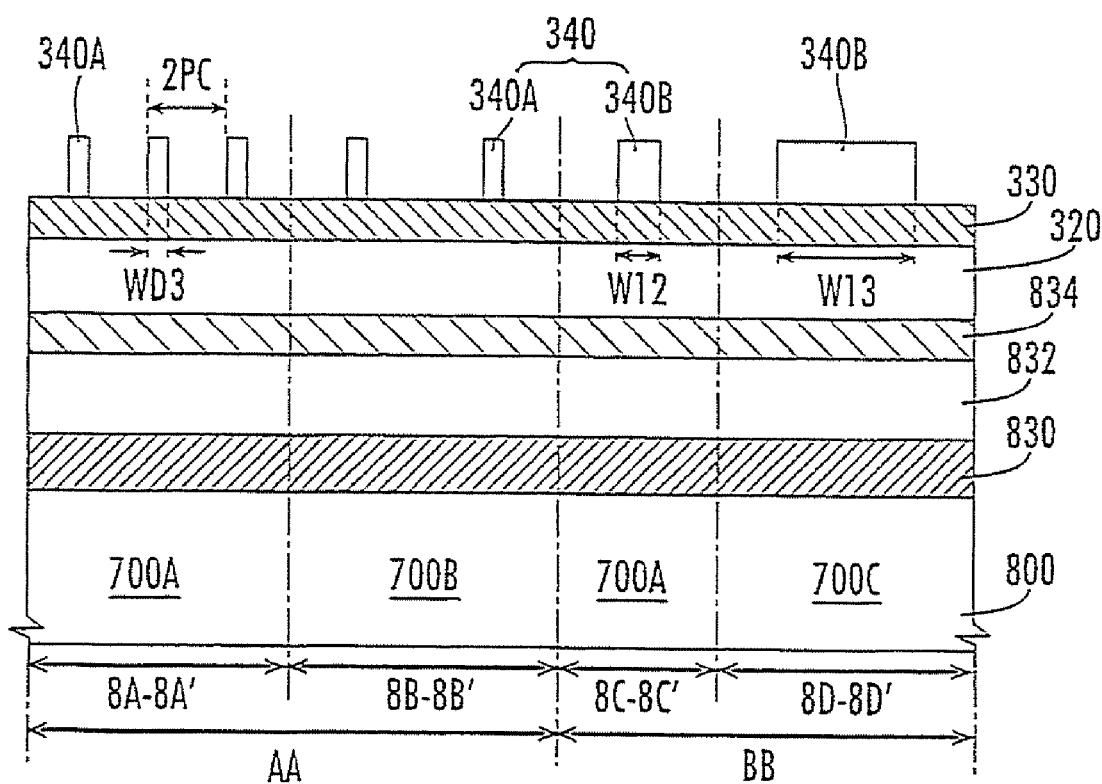

According to FIG. 8b, a plurality of preliminary patterns 340A and 340B having different spacings and widths are formed on the etch mask layer 330. For example, the spacing between elements 340A in the preliminary pattern illustrated by cross section 8A-8A' may be 2 PC and may have a width of WD3. A width of element 340B shown by cross section 8C-8C' may be W12, and the width of element 340B shown according to cross section 8D-8D' may be W13.

Figure 9A:
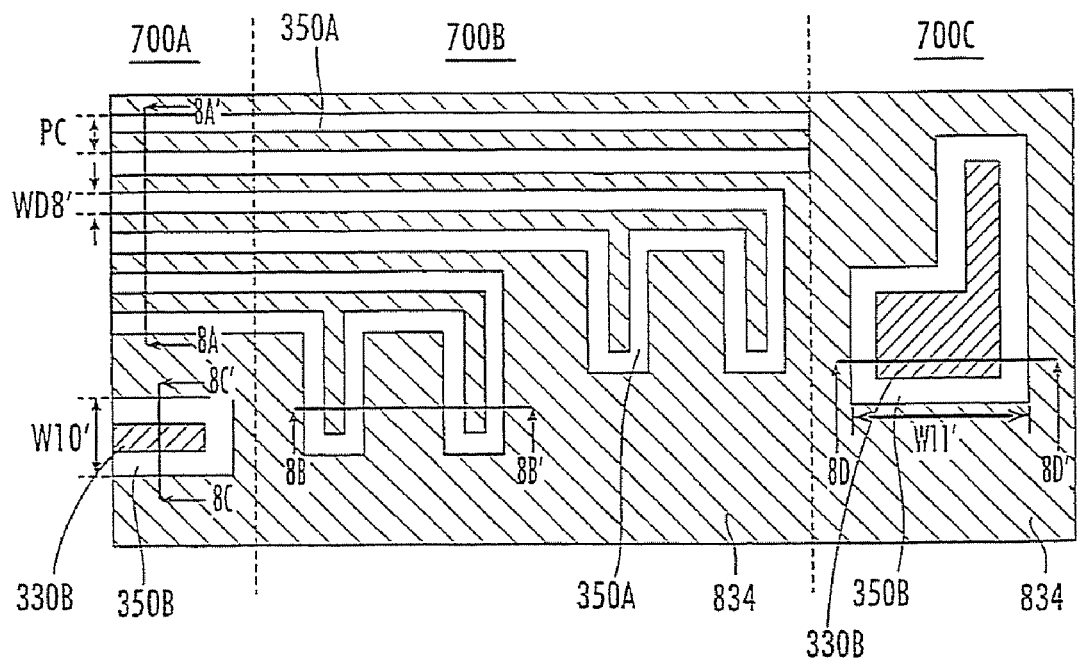
Figure 9B:
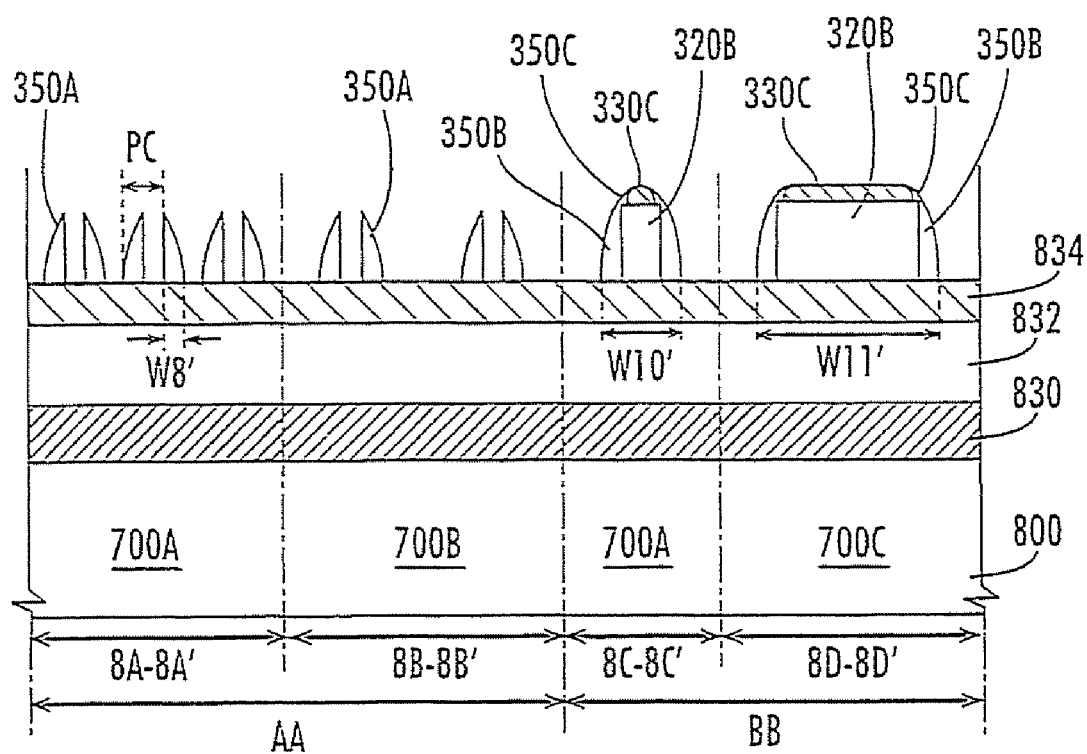

As shown in FIGS. 9a and 9b, a plurality of mask patterns are formed in the different regions of the device using self aligned reverse patterning so that elements therein have different widths in some embodiments according to the inventive concept. In particular, spacers 350A and 350B (some of which include loop-shaped portions) are formed in different regions of the substrate, as similarly described above with reference to FIGS. 3a-3h. The spacers 350A shown according to cross sections 8A-8A' and 8B-8B' have a different width than the spacers 350B shown according to cross sections 8C-8C' and 8D-8D'. In particular, the mask pattern defined by spacers 350A in region AA have a width of W8' and a spacing PC. The mask pattern defined by spacers 350B and 350C and structures 320B and 330C in region BB have widths of W10' (in cross section 8C-8C') and W11' (in cross section 8D-8D').

Figure 10A:
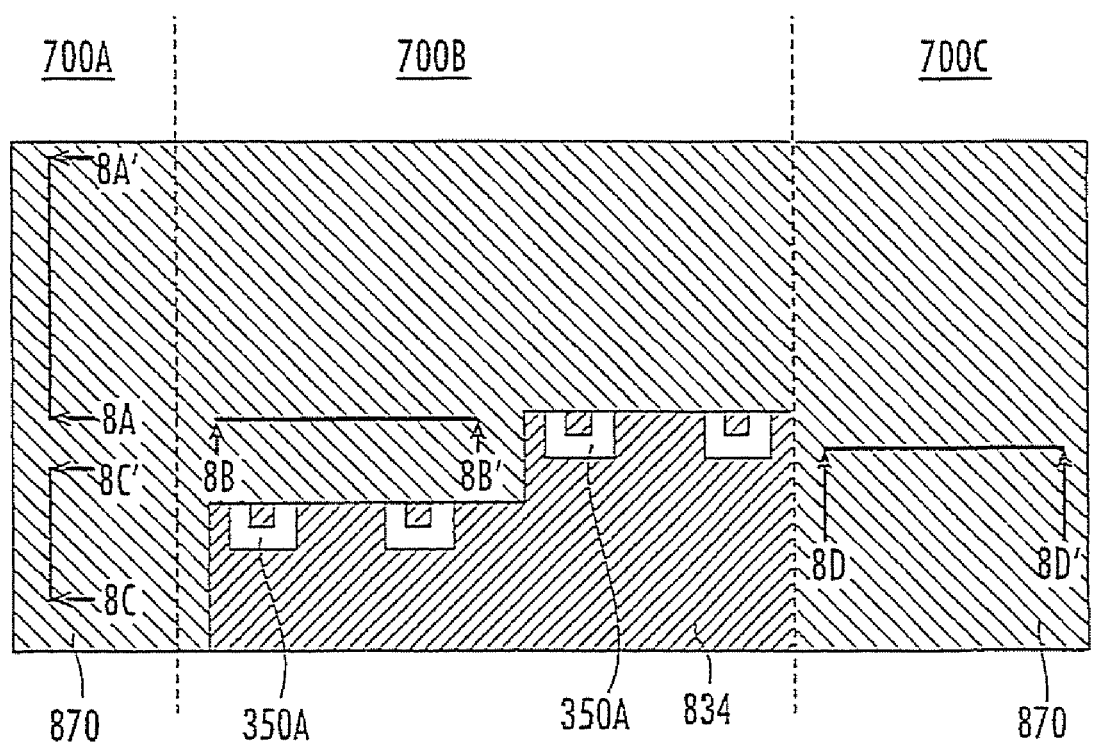
Figure 10B:
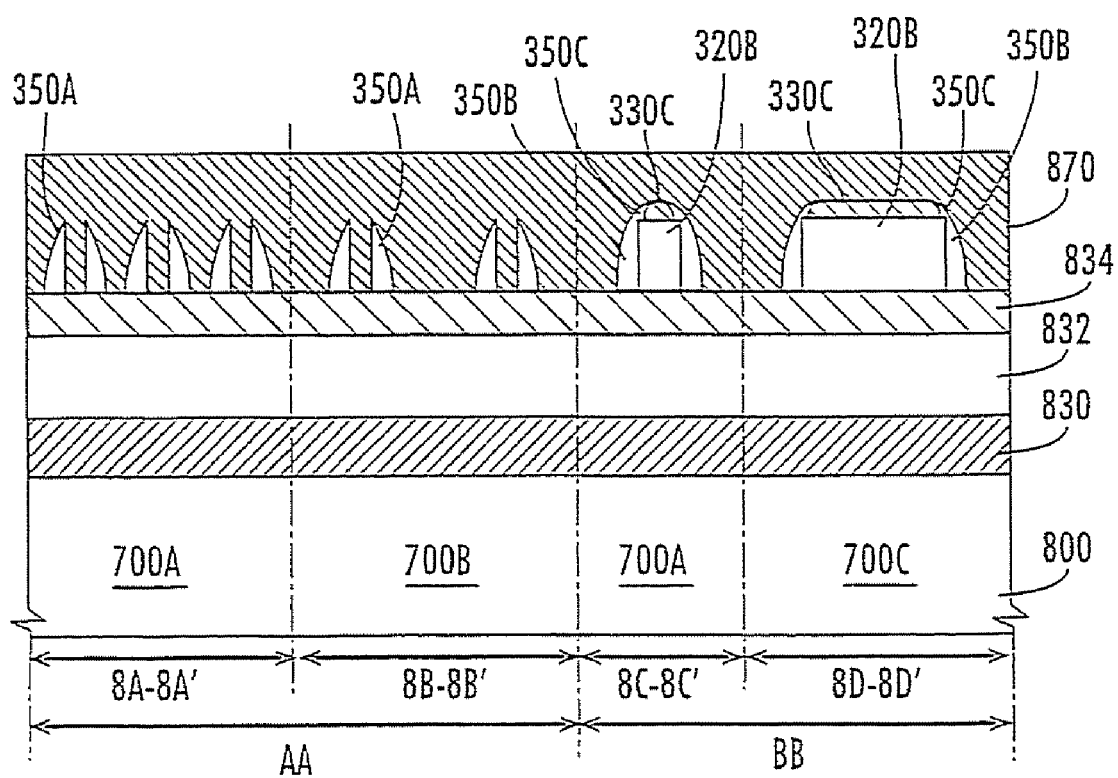

Referring now to FIGS. 10a and 10b, a separation mask pattern 870 is formed over the mask patterns in regions 700A, 700B, and 700C, and is patterned to partially expose, for example, the loop-shaped portions of the spacers 350A. It will be understood that in some embodiments according to the inventive concept the separation mask pattern 870 can be a photoresist material.

Figure 11A:
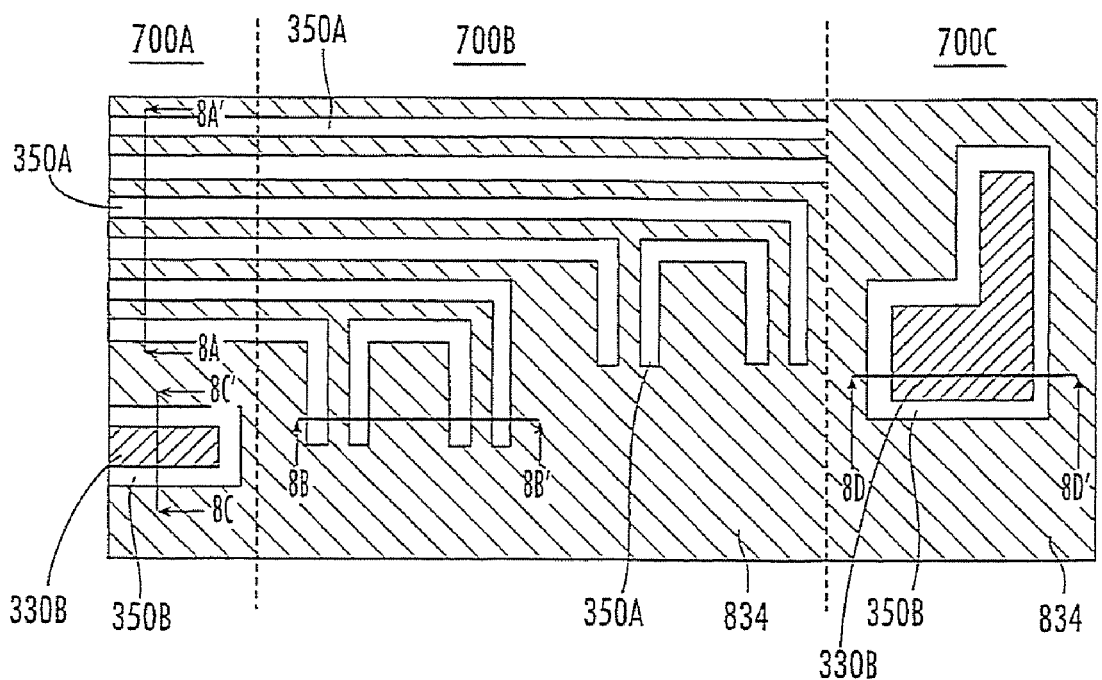
Figure 11B:
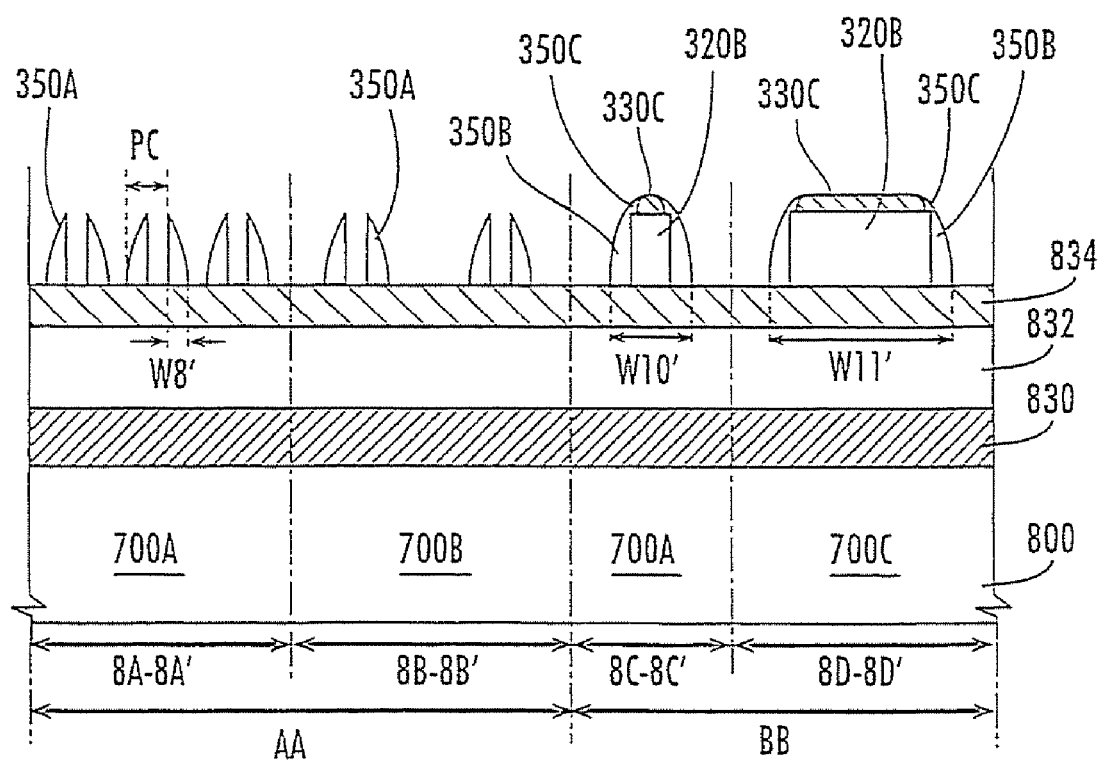
Figure 12A:
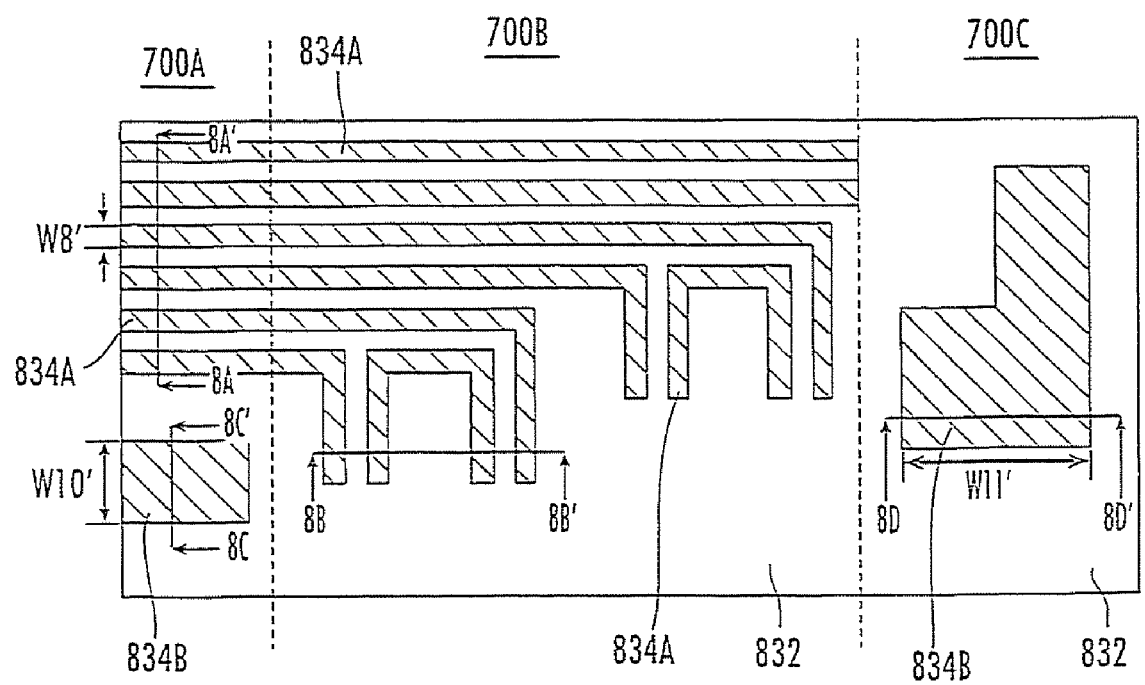
Figure 12B:
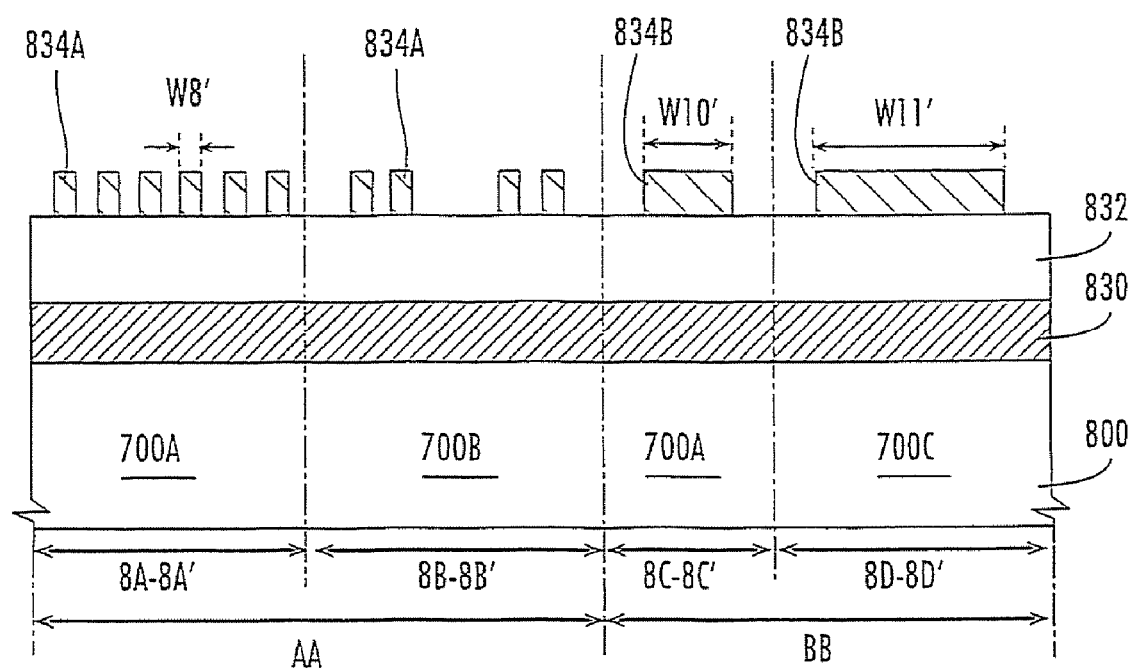

According to FIGS. 11a and 11b, the exposed loop-shaped portions of the spacers 350A shown in FIG. 10a are removed (sometimes referred to as trimmed) to separate portions of the spacers 350A from one another to define two separate spacers, as shown in FIG. 11a for example. The separation mask pattern 870 is also removed. As shown in FIGS. 12a and 12b, the elements 350A (in region AA) and the elements 350B, 350C, 320B, and 330C (in region BB) of the mask pattern are used to etch the underlying buffer mask layer 834 to define features or patterns 834A (in region AA) and 834B (in region BB).

Figure 13A:
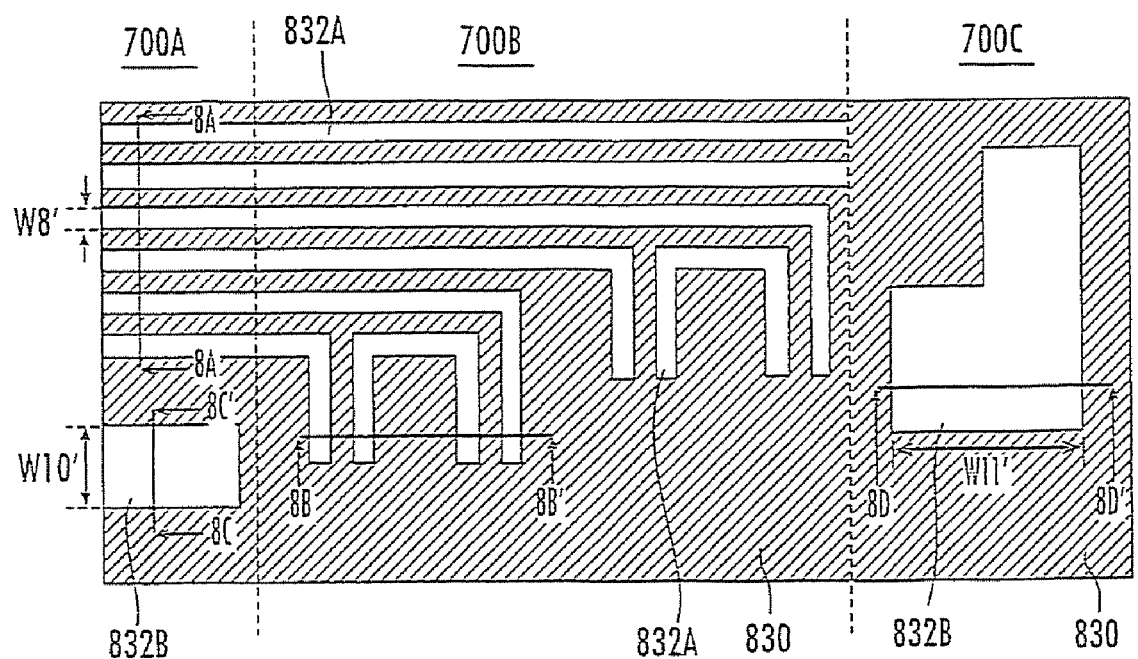
Figure 13B:
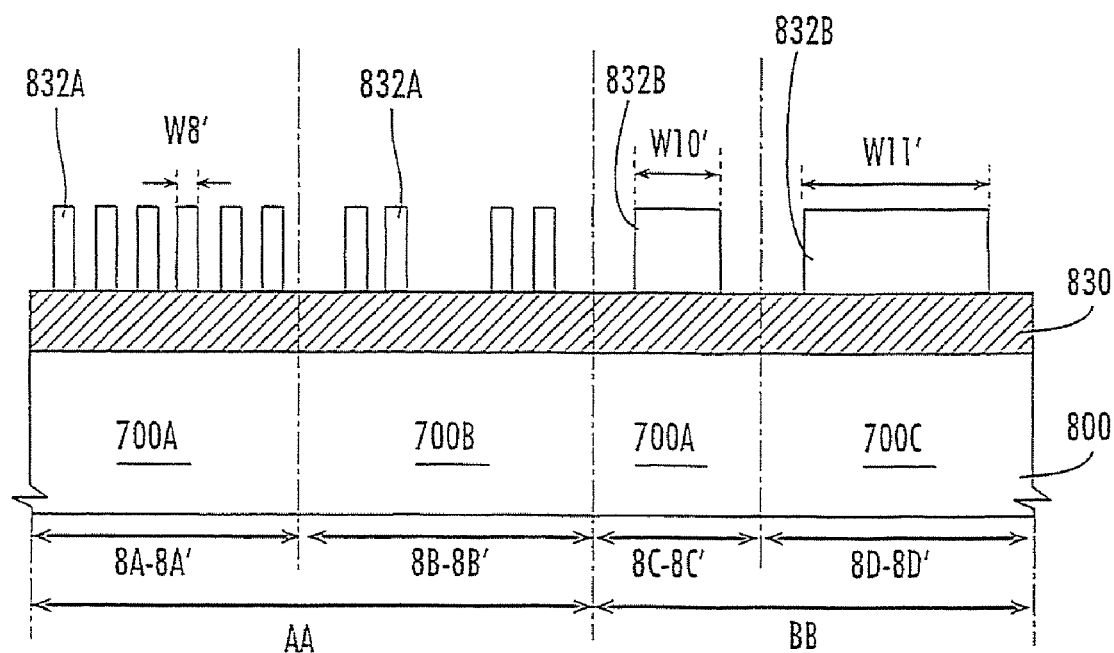
Figure 14A:
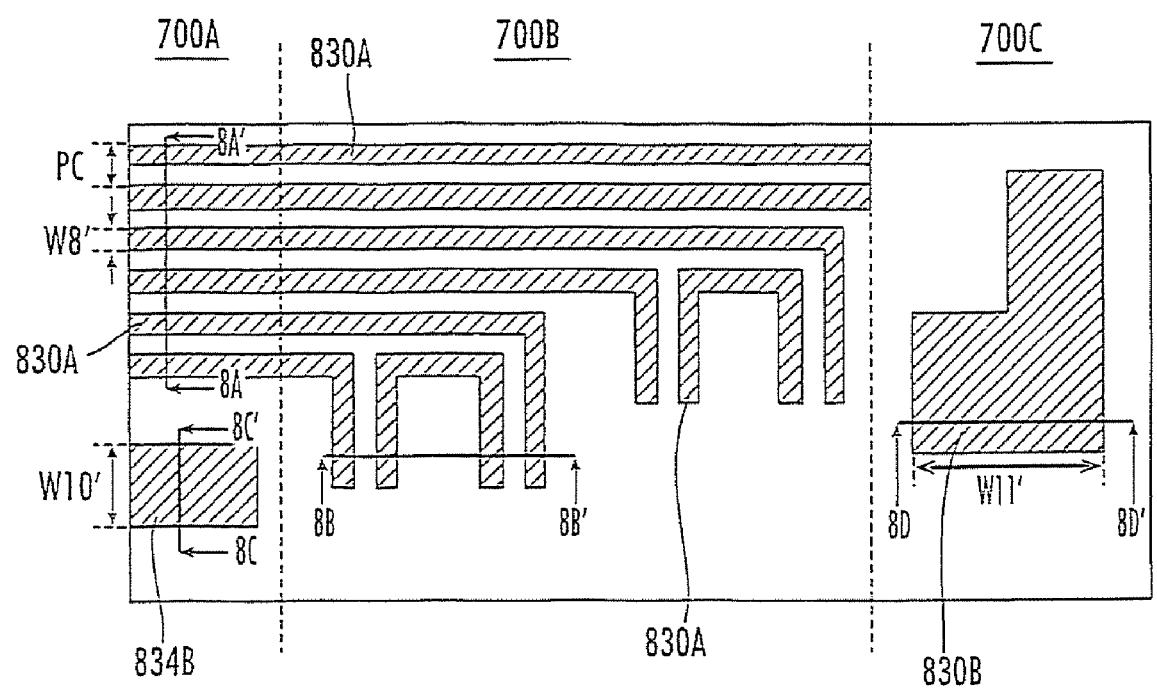
Figure 14B:
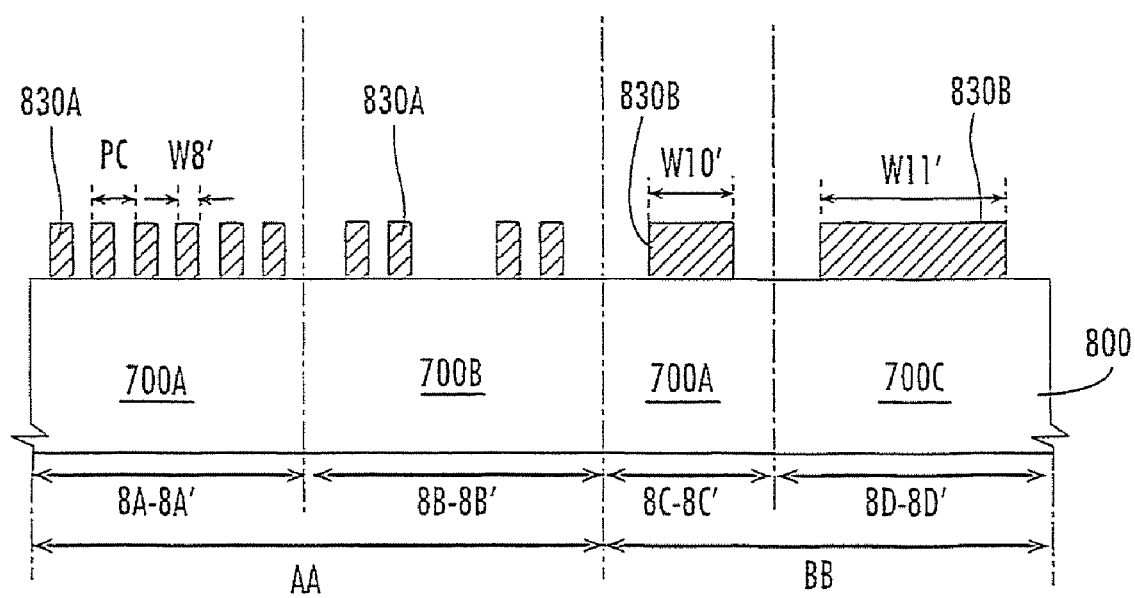

Referring to FIGS. 13a and 13b, the features 834A and 834B are used as a mask to form a reverse pattern including elements 832A and 832B on the conductive line layer 830. According to FIGS. 14a and 14b, the conductive line layer 830 is etched using the reverse pattern 832A and 832B to form conductive line patterns 830A and 830B on the substrate 800. The conductive line patterns 830A may correspond to the conductive lines 701-732 and/or the dummy conductive lines 750 of FIG. 7 in some embodiments. The conductive line patterns 830B may correspond to the SSL, GSL, and/or conductive pattern 772 in FIG. 7 in some embodiments.

Figure 15A:
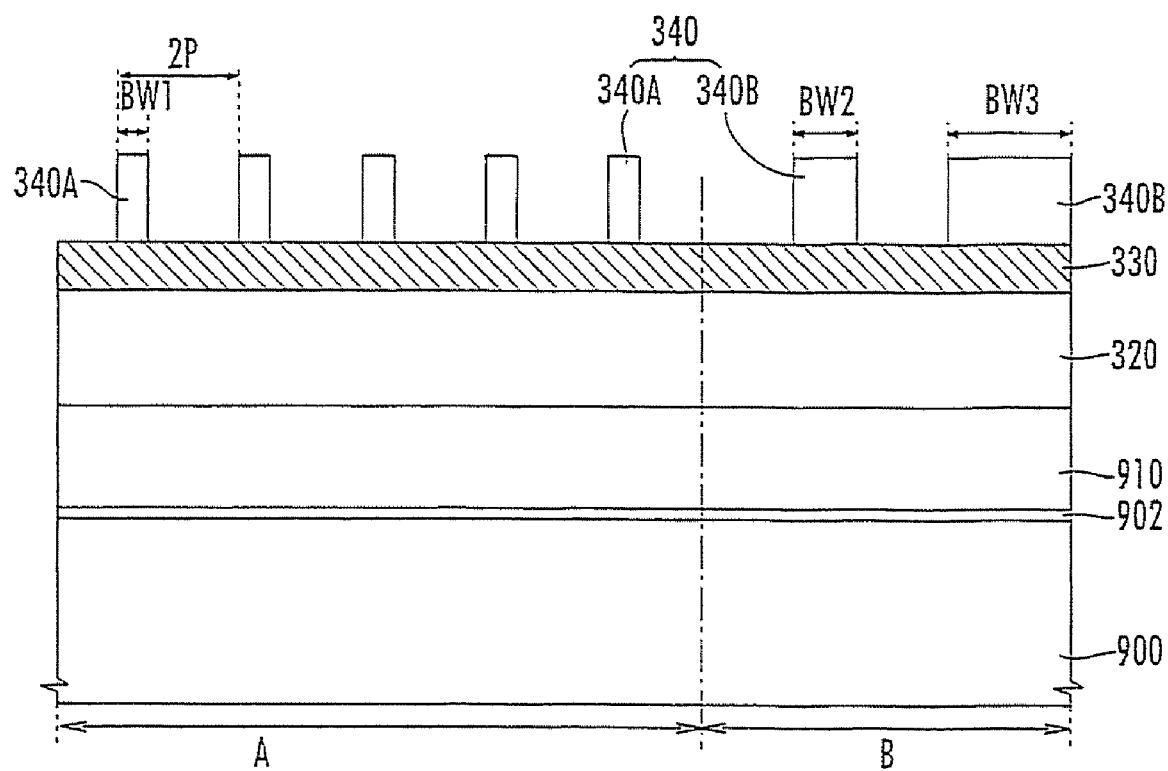
FIGS. 15a-15e are cross-sectional views that illustrate methods of forming a plurality of mask patterns used in a damascene process in further embodiments according to the inventive concept.

FIGS. 15a-15e are cross-sectional views that illustrate methods of forming a plurality of mask patterns used in a damascene process in further embodiments according to the inventive concept. As shown in FIG. 15a, an etch stop layer 902, a mold layer 910, a dual mask layer 320, an etch mask layer 330, and a preliminary mask pattern 340 (including elements 340A and 340B) are formed on regions A and B of a substrate. The elements 340A in region A may have a same width of BW1 and a pitch of 2 P, while the elements 340B in region B may have different widths BW2 and BW3. As similarly described above with reference to FIGS. 3a-3h, the elements 340A and 340B are used as a preliminary mask to pattern the etch mask layer 330 and the dual mask layer 320 to define a first mask pattern (including elements 320A and 330A) in region A, and a second mask pattern (including elements 320B and 330B) in region B. An isotropic etching process is used to remove the etch mask pattern 330A from region A without completely removing the etch mask pattern 330B from region B (to define a remaining etch mask pattern 330C), and a spacer layer is formed on the mask patterns and etched back to define sidewall spacers 350A in region A and 350B/350C in region B.

Figure 15B:
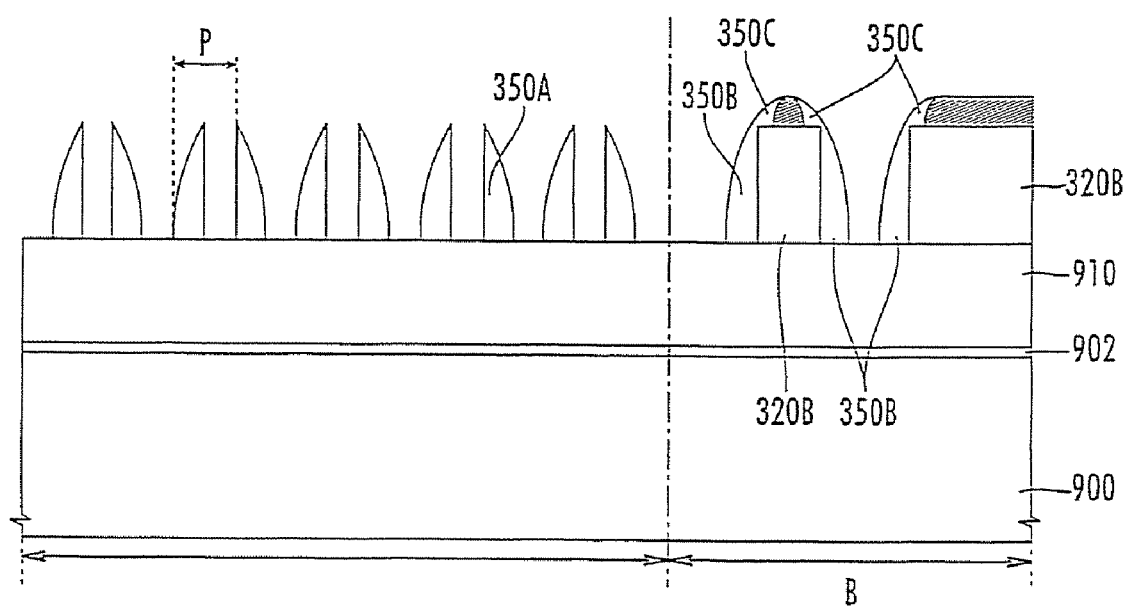

As shown in FIG. 15b, the dual mask elements 320A are removed such that the spacers 350A remain in region A to define portions of a self aligned reverse mask pattern on the mold layer 910 in region A with a spacing of P, while the spacers 350B and 350C and the structures 320B and 330C therebetween define portions of the self-aligned reverse mask pattern on the mold layer 910 in region B.

Figure 15C:
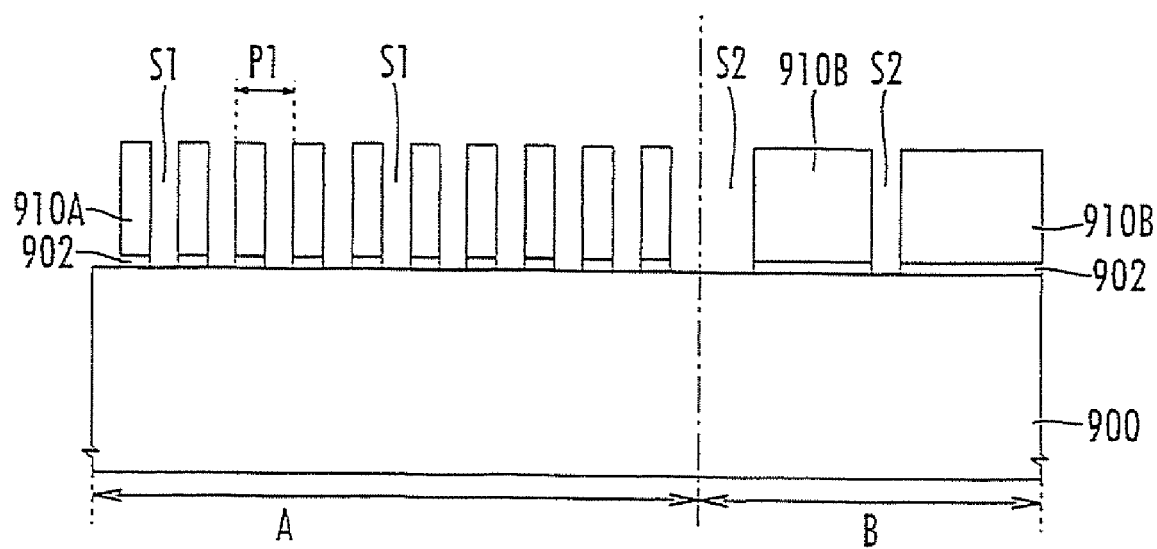

According to in FIG. 15c, the mold layer 910 is etched using the mask pattern defined by the spacers 350A (in region A) and the mask pattern defined by the spacers 350B and 350C and the structures 320B and 330C (in region B) as a mask to define a mold pattern including elements 910A and 910B in regions A and B, respectively. The mold pattern 910A in region A have pitch P1, and define smaller openings S1 therebetween than at least some of the openings S2 defined between the mold patterns 910B in region B. Portions of the etch stop layer 902 exposed by the openings S1 and S2 in the mold pattern 910A/910B may also be removed.

Figure 15D:
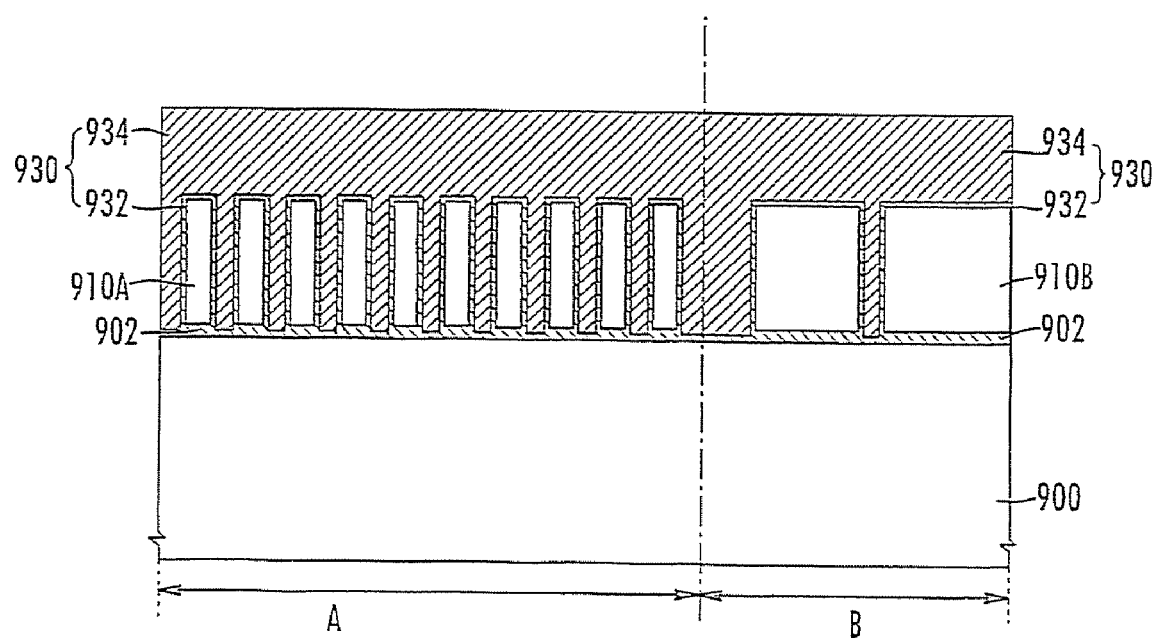

As shown in FIG. 15d, a damascene conductive layer 930, which includes a barrier layer 932 and a metal layer 934, is formed on the mold pattern 910A/910B to fill the openings S1 and S2 therebetween. The barrier layer 932 may be about 5~150 Å thick, and may be formed of a material such as Ta, TaN, TiN, TaSiN, TiSiN, and/or a combination thereof using a CVD or sputtering process. However, the barrier layer 932 may be omitted in some embodiments. The metal layer 934 may be formed of a material such as Cu, W, and/or Al, and may be formed by PVD or electroplating in some embodiments. For example, a first Cu layer (with a thickness of about 100~500 Å) may be formed by a PVD process, and a second Cu layer (with a thickness of about 1000~10000 Å) may be formed by an electroplating process using the first Cu layer as a seed layer.

Figure 15E:
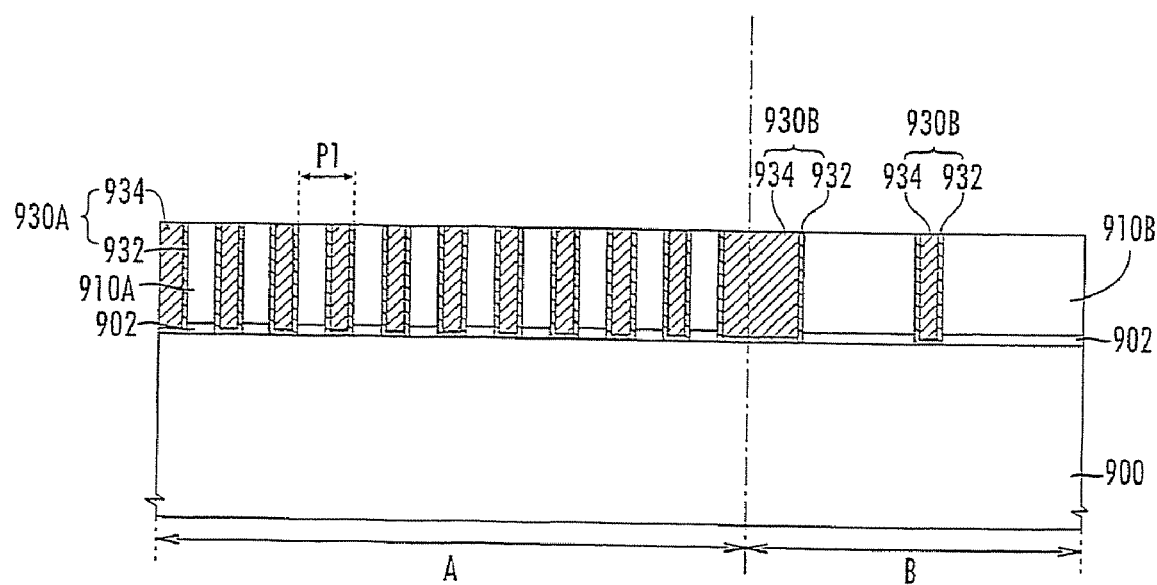

Referring to FIG. 15e, portions of the conductive layer 930 outside of the openings S1 and S2 in the mold pattern 910A/910B are removed by a planarization process to define a plurality of conductive line patterns 930A and 930B in regions A and B, respectively. For example, an etch back process and/or a CMP process may be used in some embodiments. The mold pattern 910A/910B may be removed to define relatively fine conductive line patterns 930A in region A, and relatively larger conductive line patterns 930B in region B. The conductive line patterns 930A may correspond to the conductive lines 701-732 of FIG. 7 in some embodiments, while the conductive line patterns 930B may correspond to the SSL, GSL, and/or conductive pattern 772 in FIG. 7 in some embodiments.

As described above, embodiments according to the inventive concept can provide for the simultaneous formation of a plurality of mask patterns using self aligned reverse patterning where the masks patterns include respective mask pattern elements that have different widths. For example, in some embodiments according to the inventive concept, mask elements having different widths and/or different spacings therebetween can be formed simultaneously on a feature layer, which may be subsequently etched using the mask patterns having different size/space elements therein.

Still further, in some embodiments according to the inventive concept, one of the mask patterns can be formed by removing structures that have sidewall spacers formed thereon in one area of the device, whereas a second area of the device includes a structure that is maintained between the sidewall spacers. In particular, the structures may include at least two layers having different etch selectivities, where the thickness of the topmost layer in the structure on the second area is greater than half of the width of the structure in the first area. Accordingly, when both structures are isotropically etched, the topmost layer of the structure in the first area may be removed without completely removing the topmost layer of the structure in the second area, and the remaining topmost layer of the structure in the second area may be used as a mask to remove the structures from the first area. Thus, in the first area described above, the mask elements may include the sidewall spacers themselves, which are left behind once the structure is removed from the first area. The mask element in the second area, however, can include both the sidewall spacers as well as the structure maintained therebetween. Accordingly, the different elements included in the different mask patterns in different areas of the device can have different sizes, which may be used to pattern one or more device layers in subsequent steps to provide features having different sizes.

That which is claimed:

1. A method of fabricating a semiconductor device, the method comprising:
   forming first and second mask structures on respective first and second regions of a feature layer, each of the first and second mask structures comprising a dual mask pattern and an etch mask pattern thereon having an etch selectivity relative to the dual mask pattern;
   isotropically etching the etch mask pattern of both the first and second mask structures to remove the etch mask pattern from the first mask structure and partially remove the etch mask pattern from the second mask structure such that at least a portion of the etch mask pattern on the second mask structure remains;
   forming spacers on opposing sidewalls of the first and second mask structures; and
   selectively removing the first mask structure from between the spacers in the first region using the portion of the etch mask pattern on the second mask structure as a mask to define a first mask pattern comprising the opposing sidewall spacers with a void therebetween in the first region and a second mask pattern comprising the opposing sidewall spacers with the second mask structure therebetween in the second region.

2. The method of claim 1, further comprising:
   patterning the feature layer using the first mask pattern as a mask to define a first feature on the first region and using the second mask pattern as a mask to define a second feature on the second region having a greater width than the first feature.

3. The method of claim 1, wherein, prior to isotropically etching, a thickness of the etch mask pattern of the second mask structure is greater than half of a width of the etch mask pattern of the first mask structure.

4. The method of claim 1, wherein forming the spacers comprises:
   forming a spacer mask layer on the first and second mask structures, the spacer mask layer having an etch selectivity relative to the etch mask pattern and/or the dual mask pattern; and
   etching the spacer mask layer to expose respective surfaces of the first and second mask structures between the opposing sidewalls thereof,
   and wherein selectively removing the first mask structure comprises:
   etching the exposed surfaces of the first mask structure and the second mask structure using the portion of the etch mask pattern on the second mask structure as a mask to remove the dual mask pattern of the first mask structure without substantially removing the dual mask pattern of the second mask structure.

5. The method of claim 1, wherein forming the first and second mask structures comprises:
   forming a dual mask layer on the first and second regions;
   forming the etch mask pattern on the dual mask layer, the etch mask pattern comprising a first portion on the dual mask layer in the first region and a second portion that is wider than the first portion on the dual mask layer in the second region; and
   patterning the dual mask layer using the etch mask pattern as a mask to define the first mask structure on the first region and the second mask structure on the second region having a width greater than a width of the first mask pattern.

6. The method of claim 5, wherein forming the etch mask pattern comprises:
   forming an etch mask layer on the dual mask layer on the first and second regions;
   forming a mask pattern on the etch mask layer including a first portion on the first region and a second portion on the second region; and
   patterning the etch mask layer using the mask pattern to define the etch mask pattern on the dual mask layer.

7. The method of claim 5, wherein the dual mask layer comprises at least one of a silicon-containing layer and a carbon-containing layer.

8. The method of claim 1, wherein the first region comprises a memory cell active region, and wherein the second region comprises a peripheral circuit region.

9. The method of claim 1, wherein the feature layer comprises a semiconductor substrate, and further comprising the following prior to forming the first and second mask structures:
   forming a pad oxide layer on the first and second regions of the substrate; and
   forming a hardmask layer on the pad oxide layer on the first and second regions of the substrate,
   wherein forming the first and second mask structures comprises forming the first and second mask structures on the hardmask layer.

10. The method of claim 9, wherein forming the hardmask layer comprises:
    forming a first hardmask layer on the pad oxide layer; and forming a second hardmask layer on the first hardmask layer, the second hardmask layer comprising a material having an etch selectivity relative to that of the first hardmask layer.

11. The method of claim 9, further comprising:

forming a buffer mask layer on the hardmask layer prior to forming the first and second mask structures, the buffer mask layer comprising a material having an etch selectivity relative to that of the hardmask layer.

12. The method of claim 11, further comprising:

patterning the buffer mask layer using the spacers as a mask to define a first portion of a buffer mask pattern on the first region, and using the second mask structure and the spacers on the opposing sidewalls thereof as a mask to define a second portion of the buffer mask pattern on the second region, wherein the second portion is wider than the first portion;

patterning the hardmask layer using the buffer mask pattern as a mask to define a hardmask pattern exposing portions of the pad oxide layer;

patterning the pad oxide layer and the substrate using the hardmask pattern as a mask to define a first isolation trench in the first region of the substrate and a second isolation trench in the second region of the substrate; and filling the first and second isolation trenches with an insulating layer to define a first active region in the first region of the substrate and a second active region in the second region of the substrate, wherein the second active region is wider than the first active region.

13. The method of claim 12, further comprising the following prior to patterning the pad oxide layer and the substrate:

forming a trench mask pattern on the hardmask pattern, the trench mask pattern including an opening therein on the second region;

patterning the hardmask pattern, the pad oxide layer, and the substrate in the second region using the opening in the trench mask pattern to define a precursor isolation trench in the second region of the substrate; and then removing the trench mask pattern, wherein patterning the pad oxide layer and the substrate comprises patterning the pad oxide layer and the substrate to define the first isolation trench in the first region of the substrate and to increase a depth of the precursor isolation trench to define the second isolation trench in the second region of the substrate, wherein the second isolation trench extends into the substrate beyond the first isolation trench.

14. The method of claim 1, wherein the feature layer comprises a conductive layer, and further comprising:

patterning the conductive layer using the spacers a mask to define a first conductive pattern on the first region and using the second mask structure and the spacers on the opposing sidewalls thereof as a mask to define a second conductive pattern on the second region having a greater width than the first conductive pattern.

15. The method of claim 14, wherein the first conductive pattern comprises at least one of a gate electrode, a bit line, a word line, and a dummy conductive line.

16. The method of claim 14, further comprising:

forming a separation mask pattern on the spacers to expose portions thereof;

selectively etching the exposed portions of the spacers using the separation mask pattern as a mask to separate ones of the spacers; and then removing the separation mask pattern.

17. The method of claim 1, wherein the first mask pattern comprises a plurality of mask elements in the first region, and wherein the second mask pattern comprises a plurality of mask elements in the second regions having respective widths greater than those of the plurality of mask elements in the first region.

18. The method of claim 17, wherein ones of the plurality of mask patterns in the first region have different widths.

19. A method of fabricating a semiconductor device, the method comprising:

forming an etch stop layer on first and second regions of a substrate;

forming a mold layer on the first and second regions of the substrate, forming first and second mask structures on the mold layer in the first and second regions of the substrate, respectively, each of the first and second mask structures comprising a dual mask pattern and an etch mask pattern thereon having an etch selectivity relative to the dual mask pattern;

isotropically etching the etch mask pattern of the first and second mask structures to remove the etch mask pattern from the first mask structure while maintaining at least a portion of the etch mask pattern on the second mask structure;

forming spacers on opposing sidewalls of the first and second mask structures;

selectively removing the first mask structure from between the spacers in the first region using the portion of the etch mask pattern on the second mask structure as a mask to define a first mask pattern comprising the opposing sidewall spacers with a void therebetween in the first region and a second mask pattern comprising the opposing sidewall spacers with the second mask structure therebetween in the second region;

patterning the mold layer using the spacers as a mask to form a first portion of a mold pattern defining a first opening on the first region of the substrate, and using the second mask structure and the spacers on the opposing sidewalls thereof as a mask to form a second portion of the mold pattern defining a second opening wider than the first opening on the second region of the substrate;

forming a conductive layer to fill the first and second openings in the mold pattern on the first and second regions of the substrate, respectively; and removing the mold pattern to define a conductive fine pattern in the first region and a conductive device pattern in the second region, wherein the conductive device pattern is wider than the conductive fine pattern.

20. A method of fabricating an integrated circuit device, the method comprising:

forming first and second mask structures on respective first and second regions of a feature layer, each of the first and second mask structures comprising a dual mask pattern and an etch mask pattern thereon having an etch selectivity relative to the dual mask pattern, wherein a thickness of the etch mask pattern of the second mask structure is greater than half of a width of the etch mask pattern of the first mask structure;

isotropically etching the etch mask pattern of the first and second mask structures in a same etching step to remove the etch mask pattern from the first mask structure and partially remove the etch mask pattern from the second mask structure such that at least a portion of the etch mask pattern on the second mask structure remains;

forming spacers on opposing sidewalls of the first and second mask structures;

selectively removing the first mask structure from between the spacers using the portion of the etch mask pattern on the second mask structure as a mask; and patterning the feature layer using the spacers as a mask to define a first plurality of features on the first region, and using the second mask structure and the spacers on the opposing sidewalls thereof as a mask to define a second plurality of features on the second region having respective widths greater than those of the first plurality of features in the first region.

* * * * *